United States Patent
Lee et al.

(10) Patent No.: US 9,870,043 B2
(45) Date of Patent: Jan. 16, 2018

(54) MEMORY DEVICE OF ADAPTIVELY CALIBRATING TIMING MARGIN AND INTEGRATED CIRCUIT INCLUDING THE SAME

(71) Applicants: Jong-Pil Lee, Suwon-si (KR); Su-Hyun Yun, Seoul (KR); Jae-Seung Choi, Suwon-si (KR); Jung-Hun Heo, Suwon-si (KR)

(72) Inventors: Jong-Pil Lee, Suwon-si (KR); Su-Hyun Yun, Seoul (KR); Jae-Seung Choi, Suwon-si (KR); Jung-Hun Heo, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 285 days.

(21) Appl. No.: 14/611,522

(22) Filed: Feb. 2, 2015

(65) Prior Publication Data

US 2015/0287444 A1   Oct. 8, 2015

(30) Foreign Application Priority Data

Apr. 4, 2014   (KR) .......................... 10-2014-0040325

(51) Int. Cl.
*G06F 1/00*   (2006.01)
*G06F 1/26*   (2006.01)
(Continued)

(52) U.S. Cl.
CPC ............ *G06F 1/3275* (2013.01); *G06F 1/324* (2013.01); *G11C 7/08* (2013.01); *G11C 7/1045* (2013.01);
(Continued)

(58) Field of Classification Search
CPC ...... G06F 1/3275; G06F 1/324; G06F 1/3206; G06F 1/3296; G06F 13/1689; G11C 7/08;
(Continued)

(56) References Cited

U.S. PATENT DOCUMENTS 5,630,086 A *  5/1997  Marietta ............. G06F 13/1657
                                                          365/230.09
6,535,986 B1 *  3/2003  Rosno .................... G06F 1/3203
                                                          713/400
(Continued)

FOREIGN PATENT DOCUMENTS

JP   2007-115362 A   5/2007
JP   2007-242124 A   9/2007
JP   2009-266329 A   11/2009

*Primary Examiner* — Ji H Bae
(74) *Attorney, Agent, or Firm* — Sughrue Mion, PLLC

(57) ABSTRACT

An integrated circuit, a method of controlling an operation timing of a memory device, an application processor, and a power manager are provided. The application processor includes: a power manager configured to determine a first operating power level, from among a plurality of operating power levels, to determine a first timing margin corresponding to the first operating power level, to generate a first gray code signal indicating the first timing margin, and to output the first gray code signal; and a first memory device configured to adjust an operation timing according to the first timing margin indicated by the first gray code signal, wherein the power manager is configured to provide the first operating power level to the first memory device.

19 Claims, 18 Drawing Sheets

(51) Int. Cl.
  *G06F 1/32* (2006.01)
  *G06F 13/00* (2006.01)
  *G11C 7/08* (2006.01)
  *G11C 7/10* (2006.01)
  *G11C 11/419* (2006.01)
  *G11C 5/14* (2006.01)
  *G11C 7/04* (2006.01)
  *G11C 7/22* (2006.01)

(52) U.S. Cl.
  CPC .............. *G11C 11/419* (2013.01); *G11C 5/14* (2013.01); *G11C 7/04* (2013.01); *G11C 7/22* (2013.01)

(58) Field of Classification Search
  CPC ....... G11C 7/1045; G11C 11/419; G11C 5/14; G11C 7/04; G11C 7/22
  USPC ................... 713/300, 320, 322; 711/167
  See application file for complete search history.

(56) References Cited

U.S. PATENT DOCUMENTS

| | | | |
|---|---|---|---|
| 6,999,354 B2 | 2/2006 | Aitken et al. | |
| 7,382,655 B2 | 6/2008 | Lin | |
| 7,505,345 B2 | 3/2009 | Wang et al. | |
| 7,633,833 B2 | 12/2009 | Takemura et al. | |
| 7,650,481 B2 | 1/2010 | Walker | |
| 7,827,431 B2 | 11/2010 | Fujimoto | |
| 7,859,940 B2 | 12/2010 | Hirano | |
| 7,903,116 B1* | 3/2011 | Klock | G06F 1/3203 345/501 |
| 8,018,784 B2 | 9/2011 | Hotta et al. | |
| 8,379,478 B2 | 2/2013 | Anvar et al. | |
| 8,639,952 B1* | 1/2014 | Chan | G06F 1/26 713/300 |
| 2005/0180228 A1* | 8/2005 | Canada | G11C 7/08 365/194 |
| 2010/0138684 A1* | 6/2010 | Kim | G06F 1/3225 713/601 |
| 2011/0258475 A1* | 10/2011 | Lee | G06F 13/1689 713/401 |
| 2012/0081976 A1* | 4/2012 | Widjaja | G11C 11/404 365/189.011 |
| 2012/0117402 A1* | 5/2012 | Machnicki | G06F 1/324 713/322 |
| 2013/0194859 A1 | 8/2013 | Liaw | |
| 2013/0258747 A1 | 10/2013 | Chang et al. | |
| 2013/0286717 A1 | 10/2013 | Adams et al. | |
| 2013/0301368 A1* | 11/2013 | Bansal | G11C 7/222 365/194 |

* cited by examiner

31

| VOLTAGE | FREQENCY | TIMING MARGIN |
|---|---|---|
| 1.2V | 2GHz | 1 |
| 1.0V | 1GHz | 2 |
| 0.8V | 500MHz | 3 |
| ⋮ | ⋮ | ⋮ |

FIG. 4

| DECIMAL | BINARY | GRAY |
|---------|--------|------|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |
| 10 | 1001 | 1111 |
| 11 | 1010 | 1110 |
| 12 | 1100 | 1010 |
| 13 | 1101 | 1011 |
| 14 | 1110 | 1001 |
| 15 | 1111 | 1000 |

MEMORY DEVICE OF ADAPTIVELY CALIBRATING TIMING MARGIN AND INTEGRATED CIRCUIT INCLUDING THE SAME

CROSS-REFERENCE TO RELATED APPLICATION

This application claims priority from Korean Patent Application No. 10-2014-0040325, filed on Apr. 4, 2014 in the Korean Intellectual Property Office (KIPO), the disclosure of which is incorporated by reference in its entirety herein.

BACKGROUND

1. Technical Field

Apparatuses and methods consistent with exemplary embodiments relate generally to integrated circuits, and more particularly to a memory device for adaptively calibrating a timing margin and an integrated circuit including the memory device.

2. Discussion of the Related Art

Recently, many integrated circuits have adopted a dynamic voltage and frequency scaling (DVFS) scheme for low-power operations. To enhance a performance of an embedded memory such as a static random access memory (SRAM) included in the integrated circuit, a timing margin or an operation timing must be adjusted according to a change of an operating voltage or a driving voltage. In some related art schemes, if the integrated circuit has simple clock domains or power domains, a clock signal may be stopped to prevent operation errors while the operating voltage and the timing margin are changed. However, when the integrated circuit has complex clock domains using many clock signals, such a clock-stop scheme may cause performance degradation of the integrated circuit.

SUMMARY

At least one exemplary embodiment provides a memory device of adaptively calibrating a timing margin without stopping an operation when an operating power level is changed.

At least one exemplary embodiment provides an integrated circuit including a memory device of adaptively calibrating a timing margin without stopping an operation when an operating power level is changed.

At least one exemplary embodiment provides a system on chip of adaptively calibrating a timing margin without stopping an operation when an operating power level is changed.

According to an aspect of an exemplary embodiment, there is provided an application processor for a portable device, the application processor including: a power manager configured to determine a first operating power level, from among a plurality of operating power levels, to determine a first timing margin corresponding to the first operating power level, to generate a first gray code signal indicating the first timing margin, and to output the first gray code signal; and a first memory device configured to adjust an operation timing according to the first timing margin indicated by the first gray code signal, wherein the power manager is configured to provide the first operating power level to the first memory device.

The power manager may include: a storage configured to store a plurality of gray codes indicating a plurality of timing margins respectively corresponding to the plurality of operating power levels; and a register configured to obtain, from among the plurality of gray codes stored in the storage, a gray code indicating the first timing margin according to the first operating power level, and to output the first gray code signal according to the gray code.

The power manager may include: a storage configured to store a plurality of binary codes indicating a plurality of timing margins respectively corresponding to the plurality of operating power levels; an encoder configured to obtain, from among the plurality of binary codes stored in the storage, a binary code indicating the first timing margin according to the first operating power level, and to convert the binary code to a gray code; and a register configured to obtain the gray code from the encoder and to output the first gray code signal according to the gray code.

The application processor may further include a decoder configured to convert the first gray code signal output from the power manager to a first binary code signal indicating the first timing margin, and to output the first binary code signal to the first memory device, wherein the first memory device may be configured to receive the first binary code signal, and to adjust the operation timing according to the first timing margin indicated by the first binary code signal.

The power manager may be configured to generate a voltage control signal according to the first operating power level and to transmit the voltage control signal to a power controller that provides an operating voltage according to the first operating power level.

The application processor may further include a second memory device configured to receive the first gray code signal and to adjust an operation timing thereof according to the first timing margin indicated by the first gray code signal.

The application processor may further include at least one synchronization circuit configured to synchronize the first gray code signal output from the power manager, and to provide the synchronized first gray code signal to the first memory device and the second memory device.

The application processor may further include a second memory device, wherein the power manager may be configured to determine a second timing margin, to generate a second gray code signal indicating the second timing margin, and to output the first gray code signal to the first memory device and the second gray code signal to the second memory device.

The power manager may be configured to determine a second operating power level for the second memory device, to generate a voltage control signal according to the first operating power level and the second operating power level, to transmit the generated voltage control signal to a power controller that provides an operating voltage according to the first operating power level and the second operating power level, and to receive the operating voltage from the power controller; and the power manager may be configured to provide the first operating power level to the first memory device and the second operating power level to the second memory device.

The power manager may be configured to change at least one of an operating voltage and an operating frequency according to the first operating power level.

When the power manager raises an operating power level to the first operating power level, the power manager may be configured to increase the operating voltage, to decrease a timing margin after increasing the operating voltage, and to increase the operating frequency after decreasing the timing margin.

When the power manager lowers an operating power level to the first operating power level, the power manager may be configured to decrease the operating frequency, to increase a timing margin after decreasing the operating frequency, and to decrease the operating voltage after increasing the timing margin.

The power manager may be configured to output a clock control signal to a clock controller in order to change the operating frequency such that the clock controller does not stop outputting a clock signal during a change of the first operating power level.

The power manager may be configured to generate a gray code signal each time an operating power level is determined to be changed.

The power manager may be configured to change the operating power level on a sequential basis, from one operating power level to a next operating power level among the plurality of operating power levels, and to change one bit of the gray code signal each time the operating power level is sequentially changed.

The application processor may be implemented in a system on chip (SoC).

According to an aspect of another exemplary embodiment, there is provided a power manager for an application processor of a portable device, the power manager including: a storage configured to store a mapping between a plurality of operating power levels and a plurality of timing margins; and a power level determiner configured to determine a first operating power level, from among the plurality of operating power levels, to determine a first timing margin, from among the plurality of timing margins, corresponding to the first operating power level according to the mapping, and to output, to a first memory device, a first gray code signal indicating the first timing margin.

The storage may be configured to store a plurality of gray codes indicating the plurality of timing margins respectively corresponding to the plurality of operating power levels; and the power level determiner may be configured to obtain, from among the plurality of gray codes stored in the storage, a gray code indicating the first timing margin according to the first operating power level, and to output the first gray code signal according to the gray code.

The power manager may further include an encoder, wherein the storage may be configured to store a plurality of binary codes indicating the plurality of timing margins respectively corresponding to the plurality of operating power levels, wherein the encoder may be configured to obtain, from among the plurality of binary codes stored in the storage, a binary code indicating the first timing margin according to the first operating power level, and to convert the obtained binary code to a gray code, and wherein the power level determiner may be configured to obtain the gray code from the encoder and to output the first gray code signal according to the gray code.

The power lever determiner may be configured to generate a voltage control signal according to the first operating power level and to transmit the generated voltage control signal to a power controller that provides an operating voltage according to the first operating power level.

The power level determiner may be configured to receive the operating voltage from the power controller and to provide the first operating power level to the first memory device.

The power level determiner may be configured to output the first gray code signal to both the first memory device and a second memory device.

The power level determiner may be configured to output the first gray code signal to the first memory device and the second memory device via a synchronization circuit.

The power level determiner may be configured to determine a second timing margin according to the stored mapping, to generate a second gray code signal indicating the determined second timing margin, and to output the generated first gray code signal to the first memory device and the generated second gray code signal to the second memory device.

The power level determiner may be configured to determine a second operating power level for the second memory device, to generate a voltage control signal according to the first operating power level and the second operating power level, to transmit the generated voltage control signal to a power controller that provides an operating voltage according to the first operating power level and the second operating power level, and to receive the operating voltage from the power controller, and the power level determiner may be configured to provide the first operating power level to the first memory device and the second operating power level to the second memory device.

The power level determiner may be configured to change at least one of an operating voltage and an operating frequency according to the first operating power level.

When the power level determiner raises an operating power level to the first operating power level, the power level determiner may be configured to increase the operating voltage, to decrease a timing margin after increasing the operating voltage, and to increase the operating frequency after decreasing the timing margin.

When the power level determiner lowers an operating power level to the first operating power level, the power level determiner may be configured to decrease the operating frequency, to increase a timing margin after decreasing the operating frequency, and to decrease the operating voltage after increasing the timing margin.

The power level determiner may be configured to generate a gray code signal each time an operating power level is determined to be changed.

The power level determiner may be configured to change the operating power level on a sequential basis, from one operating power level to a next operating power level among the plurality of operating power levels, and to change, according to the mapping, one bit of the gray code signal each time the operating power level is sequentially changed.

According to an aspect of another exemplary embodiment, there is provided a memory device for an application processor of a portable device, the memory device including: a memory core including a memory cell; and a controller configured to receive a gray code signal indicating a timing margin corresponding to an operating power level and to control an operation timing of the memory core based on the timing margin.

The controller may include a decoder configured to convert the gray code signal to a binary code signal indicating the timing margin.

The controller may be configured to continuously receive a clock signal having an operation frequency when the operating power level is changed, and to control the operation timing based on the clock signal.

The controller may be configured to receive a gray code signal each time the operating power level is determined to be changed.

Whenever the controller receives sequential gray code signals indicating a change in the timing margin, the sequential gray code signals may differ in only one bit.

The controller may be configured to receive the gray code signal from a synchronization circuit of the application processor.

According to an aspect of another exemplary embodiment, there is provided an application processor for a portable device, the application processor including: a power manager configured to determine a first operating power level, from among a plurality of operating power levels, to determine a first timing margin corresponding to the first operating power level, to generate a first gray code signal indicating the first timing margin, and to output the first gray code signal; and a first memory device configured to adjust an operation timing according to the first timing margin indicated by the first gray code signal.

The power manager may include: a storage configured to store a plurality of gray codes indicating a plurality of timing margins respectively corresponding to the plurality of operating power levels; and a register configured to obtain, from among the plurality of gray codes stored in the storage, a gray code indicating the first timing margin according to the first operating power level, and to output the first gray code signal according to the gray code.

The power manager may include: a storage configured to store a plurality of binary codes indicating a plurality of timing margins respectively corresponding to the plurality of operating power levels; an encoder configured to obtain, from among the plurality of binary codes stored in the storage, a binary code indicating the first timing margin according to the first operating power level, and to convert the obtained binary code to a gray code; and a register configured to obtain the gray code from the encoder and to output the first gray code signal according to the gray code.

The application processor may further include a decoder configured to convert the first gray code signal output from the power manager to a first binary code signal indicating the first timing margin, and to output the first binary code signal to the first memory device, wherein the first memory device may be configured to receive the first binary code signal, and to adjust the operation timing according to the first timing margin indicated by the first binary code signal.

The power manager may be configured to generate a voltage control signal according to the first operating power level and to transmit the voltage control signal to a power controller that provides an operating voltage according to the first operating power level.

The power manager may be configured to receive the operating voltage from the power controller and to provide the first operating power level to the first memory device.

The application processor may further include a second memory device configured to receive the first gray code signal and to adjust an operation timing thereof according to the first timing margin indicated by the first gray code signal.

The application processor may further include at least one synchronization circuit configured to synchronize the first gray code signal output from the power manager, and to provide the synchronized first gray code signal to the first memory device and the second memory device.

The application processor may further include a second memory device, wherein the power manager may be configured to determine a second timing margin, to generate a second gray code signal indicating the second timing margin, and to output the first gray code signal to the first memory device and the second gray code signal to the second memory device.

The power manager may be configured to determine a second operating power level for the second memory device, to generate a voltage control signal according to the first operating power level and the second operating power level, to transmit the generated voltage control signal to a power controller that provides an operating voltage according to the first operating power level and the second operating power level, and to receive the operating voltage from the power controller, and the power manager may be configured to provide the first operating power level to the first memory device and the second operating power level to the second memory device.

The power manager may be configured to change at least one of an operating voltage and an operating frequency according to the first operating power level.

When the power manager raises an operating power level to the first operating power level, the power manager may be configured to increase the operating voltage, to decrease a timing margin after increasing the operating voltage, and to increase the operating frequency after decreasing the timing margin.

When the power manager lowers an operating power level to the first operating power level, the power manager may be configured to decrease the operating frequency, to increase a timing margin after decreasing the operating frequency, and to decrease the operating voltage after increasing the timing margin.

The power manager may be configured to output a clock control signal to a clock controller in order to change the operating frequency such that the clock controller does not stop outputting a clock signal during a change of the first operating power level.

The power manager may be configured to generate a gray code signal each time an operating power level is determined to be changed.

The power manager may be configured to change the operating power level on a sequential basis, from one operating power level to a next operating power level among the plurality of operating power levels, and to change one bit of the gray code signal each time the operating power level is sequentially changed.

The application processor may be implemented in a system on chip (SoC).

According to an aspect of another exemplary embodiment, there is provided an integrated circuit including: a power manager configured to determine an operating power level, from among a plurality of operating power levels, and to output a gray code signal according to the operating power level, the gray code signal indicating a timing margin of the determined operating power level; and a memory device configured to adjust an operation timing based on the indicated timing margin.

According to an aspect of another exemplary embodiment, there is provided a method of controlling an operation timing of a memory device, the method including: determining, by a power manager of an application processor for a portable device, an operating power level, from among a plurality of operating power levels; determining a first timing margin corresponding to the operating power level; generating a first gray code signal indicating the first timing margin; outputting the first gray code signal to a first memory device; and adjusting, by the first memory device, an operation timing according to the first timing margin indicated by the output first gray code signal.

According to an aspect of another exemplary embodiment, there is provided a method of controlling an operation timing of a memory device, the method including: determining, by a power manager of an application processor for a portable device, an operating power level, from among a plurality of operating power levels; determining a first timing margin corresponding to the operating power level; generating a first gray code signal indicating the first timing margin; and outputting the first gray code signal to a first memory device.

According to an aspect of another exemplary embodiment, there is provided a method of controlling an operation timing of a memory device, the method including: determining, by a power manager, an operating power level of an integrated circuit, from among a plurality of operating power levels; and outputting, to the memory device, a gray code signal according to the operating power level, the gray code signal indicating a timing margin corresponding to the operating power level.

According to an aspect of another exemplary embodiment, there is provided a method of controlling an operation timing of a memory device, the method including: receiving, by the memory device, a gray code signal indicating a timing margin corresponding to an operating power level; and controlling, by the memory device, an operation timing based on the timing margin.

According to an aspect of another exemplary embodiment, there is provided a method of controlling an operation timing of a memory device, the method including: determining, by a power manager of an application processor for a portable device, whether to change an operating power level; in response to determining to raise the operating power level, increasing an operating voltage, controlling to decrease a timing margin after increasing the operating voltage, and increasing an operating frequency after decreasing the timing margin; and in response to determining to lower the operating power level, decreasing the operating frequency, controlling to increase the timing margin after decreasing the operating frequency, and decreasing the operating voltage after increasing the timing margin, wherein the timing margin indicates an operation timing of a memory device.

The controlling to decrease the timing margin and the controlling to increase the timing margin each may include: determining a timing margin corresponding to the operating power level; generating a gray code signal indicating the timing margin; and outputting the gray code signal to the memory device.

The generating the gray code signal may include: obtaining, from among a plurality of gray codes stored in a storage, a gray code indicating the timing margin according to the operating power level; and generating the gray code signal according to the gray code.

The generating the gray code signal may include: obtaining, from among a plurality of binary codes stored in a storage, a binary code indicating the timing margin according to the operating power level; converting the binary code to a gray code; and generating the gray code signal according to the gray code.

According to an aspect of another exemplary embodiment, there is provided a portable device including: an application processor which includes: a power manager configured to determine an operating power level, from among a plurality of operating power levels, to determine a first timing margin corresponding to the operating power level, to generate a first gray code signal indicating the first timing margin, and to output the first gray code signal, and a first memory device configured to adjust an operation timing according to the first timing margin indicated by the first gray code signal; a power management integrated circuit (PMIC) configured to supply an operating voltage to the application processor; a dynamic random access memory (DRAM); and a flash memory, wherein the power manager is configured to provide, to the first memory device, the operating power level.

The DRAM and the application processor may be provided in a Package-on-Package.

According to an aspect of another exemplary embodiment, there is provided an integrated circuit including a power management unit and one or more memory devices. The power management unit determines an operating power level among a plurality of operating power levels and provides a gray code signal, where the operating power level corresponds to a present operating condition, and the gray code signal includes a plurality of gray bit signals indicating a timing margin of the operating power level. Each memory device adjusts an operation timing based on the gray code signal.

The integrated circuit may further include one or more decoders, and each decoder may be disposed before or inside each memory device. Each decoder may convert the gray code signal from the power management unit to a binary code signal.

The integrated circuit may further include one or more synchronization circuits, and each synchronization circuit may be disposed before each decoder. Each synchronization circuit may synchronize the gray code signal from the power management unit to provide the synchronized gray code signal to each decoder.

The power management unit may include a storage unit configured to store binary codes indicating timing margins of the power levels, respectively; an encoder configured to receive the binary code indicating the timing margin of the operating power level from the storage unit and configured to convert the binary code to a gray code; and a register configured to output the gray code signal based on the gray code from the encoder.

The power management unit may include: a storage unit configured to store gray codes indicating timing margins of the power levels, respectively; and a register configured to receive the gray code indicating the timing margin of the operating power level from the storage unit and configured to output the gray code signal based on the gray code from the storage unit.

The power management unit may change at least one of an operating voltage and an operating frequency when the operating power level is changed.

When the power management unit raises the operating power level, the power management unit may increase an operating voltage, decrease the timing margin after increasing the operating voltage, and increase an operating frequency after decreasing the timing margin.

When the power management unit lowers the operating power level, the power management unit may decrease an operating frequency, increase the timing margin after decreasing the operating frequency, and decrease an operating voltage after increasing the timing margin.

The timing margin may indicate an enable timing of a sense amplifier included in the memory device.

The power management unit may performs exclusive OR operations on binary code bits indicating the timing margin of the operating power level to provide the gray bit signals in the gray code signal.

When the power management unit changes the operating power level, the power management unit may change a logic level of one of the gray bit signals at each time to raise or lower the operating power level gradually level by level.

According to an aspect of another exemplary embodiment, there is provided a memory device including a memory core and a controller. The memory core includes a memory cell array and peripheral circuits. The controller receives a gray code signal including a plurality of gray bit signals indicating a timing margin of an operating power level where the operating power level corresponds to a present operating condition. The controller generates at least one control signal for controlling operation timing of the memory core based on the gray code signal.

The memory device may further include a decoder configured to convert the gray code signal to a binary code signal.

The controller may include a delay unit configured to delay an internal signal by a delay time corresponding to the timing margin in response to the binary code signal to output the control signal The memory device may be a static random access memory (SRAM) device that is integrated in a system on chip (SOC).

According to an aspect of another exemplary embodiment, there is provided a system on chip including at least one processor, a power management unit, and one or more memory devices. The power managements unit monitors an operating condition of the at least one processor to determine an operating power level among a plurality of power levels and provides a gray code signal, where the operating power level corresponds to a present operating condition, and the gray code signal includes a plurality of gray bit signals indicating a timing margin of the operating power level. Each memory device adjusts an operation timing based on the gray code signal.

BRIEF DESCRIPTION OF THE DRAWINGS

Exemplary embodiments will be more clearly understood from the following detailed description taken in conjunction with the accompanying drawings, in which:

FIG. 4 is a diagram illustrating a relation between binary codes and gray codes;

DETAILED DESCRIPTION OF EXEMPLARY EMBODIMENTS

Figure 1:
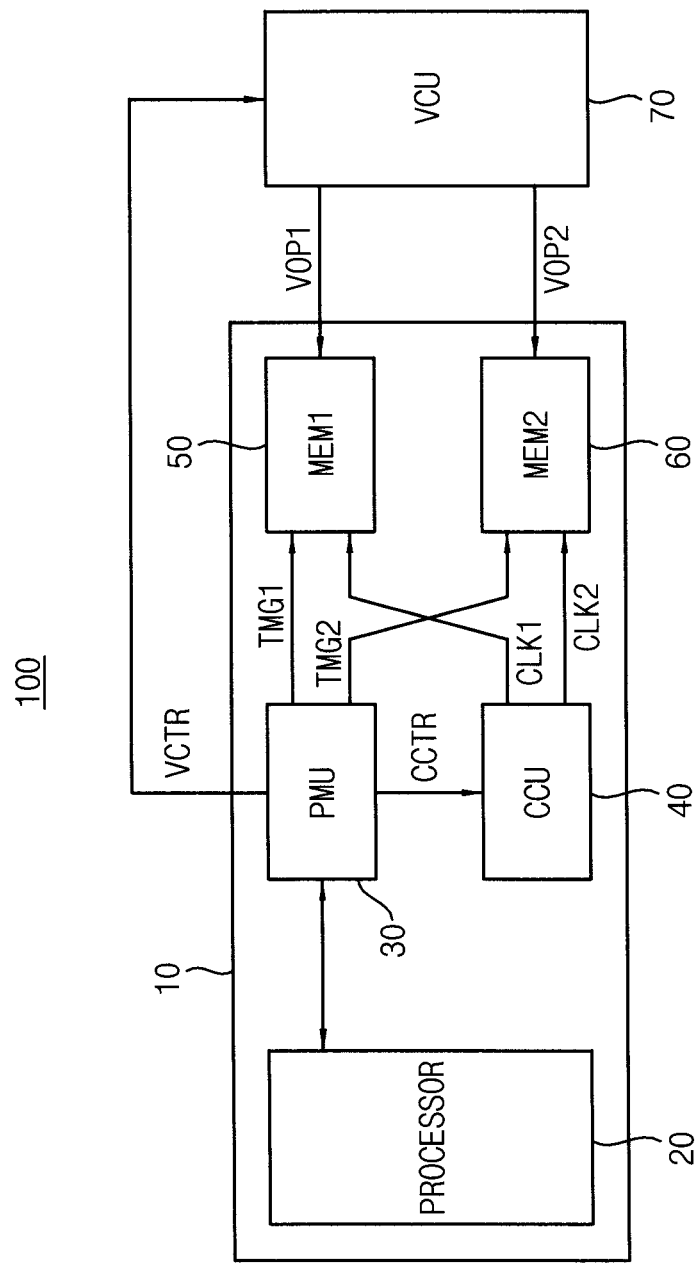
FIG. 1 is a block diagram illustrating a system according to an exemplary embodiment.

Various exemplary embodiments will be described more fully hereinafter with reference to the accompanying drawings, in which some exemplary embodiments are shown. An exemplary embodiment, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items. Similarly, expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a system 100 according to an exemplary embodiment.

Referring to FIG. 1, a system 100 may include an integrated circuit 10 and a voltage control unit (VCU) 70 (e.g., voltage controller or power controller).

The integrated circuit 10 may include at least one processor 20, a power management unit (PMU) 30 (e.g., power manager), a clock control unit (CCU) 40 (e.g., clock controller), and one or more memory devices (MEM1 and MEM2) 50 and 60.

The integrated circuit 10 may be a system on chip (SOC) in which various elements are integrated as one chip. The integrated circuit 10 may be powered by the voltage control unit 70. The voltage control unit 70 may include at least one voltage regulator. The voltage control unit 70 may be referred to as a power supply or a power management integrated circuit (PMIC). According to one or more exemplary embodiments, the voltage control unit 70 may be implemented as another chip distinct from the chip of the integrated circuit 10, or at least portion of the voltage control unit 70 may be included in the integrated circuit 10.

Even though one processor 20 is illustrated in FIG. 1 for convenience of illustration, the integrated circuit 10 may further include one or more processors or processing units. The processor 20 may be a central processing unit (CPU) for performing main functions of the integrated circuit 10. The processor 20 may be configured to perform program instructions, such as those of an operating system (OS).

Figures 2, 3:
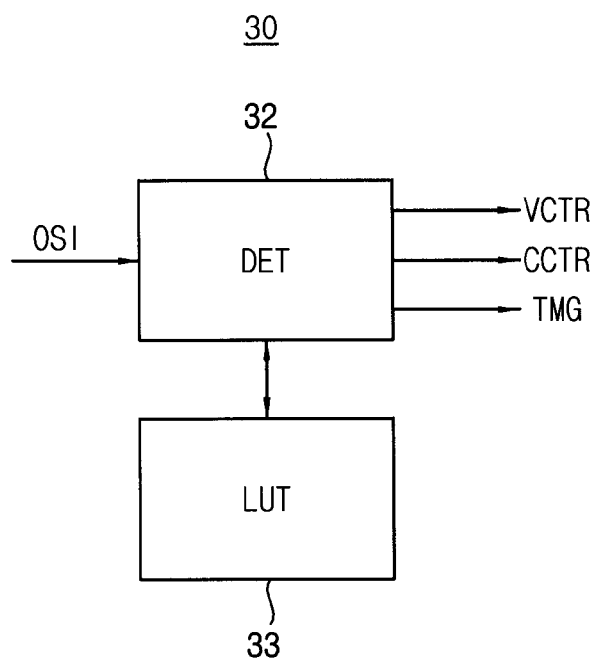
FIG. 2 is a block diagram illustrating an example of a power management unit in an integrated circuit according to an exemplary embodiment.
FIG. 3 is a diagram illustrating an example of a lookup table in a power management unit according to an exemplary embodiment.
Figure 8A:
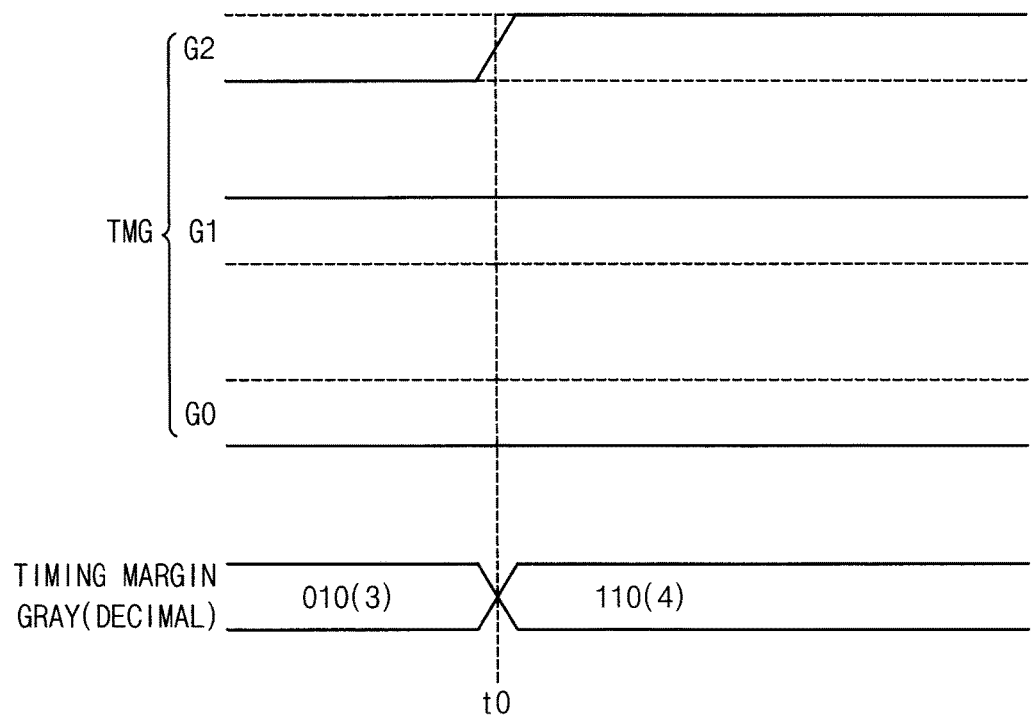
FIGS. 8A and 8B are timing diagrams illustrating an operation of a memory device receiving a gray code signal according to an exemplary embodiment.
Figure 8B:
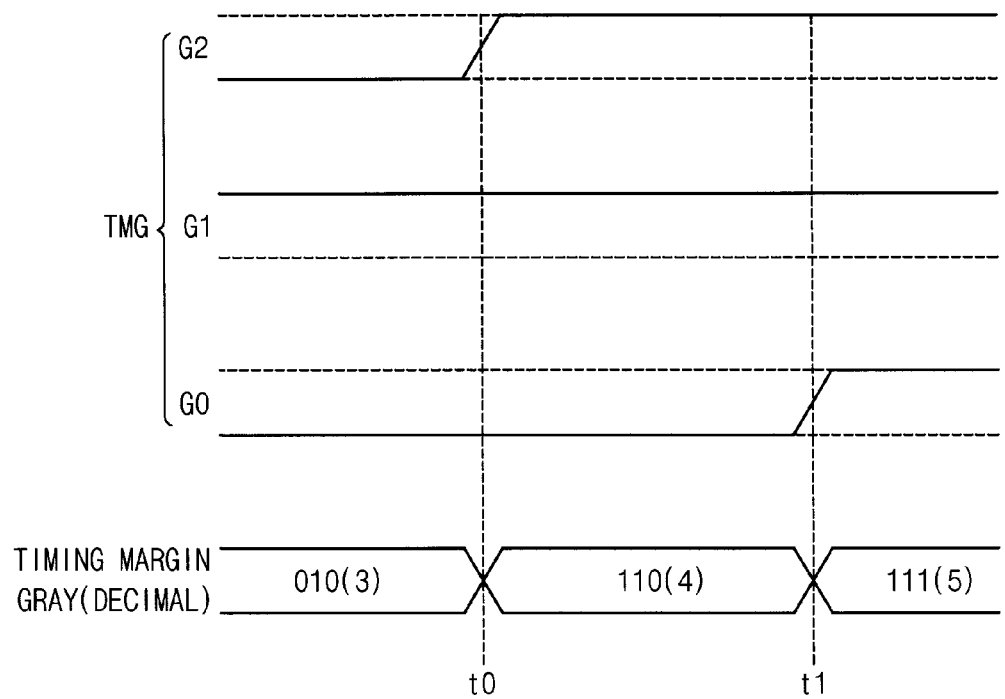

The power management unit 30 may monitor an operating status or an operating condition of the integrated circuit 10 to determine an operating power level corresponding to the present operating status or operating condition among a plurality of power levels as exemplarily illustrated in FIG. 3. The power management unit 30 may provide gray code signals TMG1 and TMG2 indicating timing margins of the determined operating power level. Each of the gray code signals TMG1 and TMG2 may include a plurality of gray bit signals as illustrated in FIGS. 8A and 8B. The gray code signals TMG1 and TMG2 for the respective memory devices 50 and 60 may be identical or different from each other to control the timing margins of the memory devices 50 and 60, respectively. For example, the gray code signals TMG1 and TMG2 may be identical when the memory devices 50 and 60 are included in the same power domain. In contrast, the gray code signals TMG1 and TMG2 may be distinct signals to indicate different and independent timing margins when the memory devices 50 and 60 are included in different power domains.

The memory devices 50 and 60 may adjust operation timings based on the gray code signals TMG1 and TMG2, respectively. By providing the timing margin using the gray code signal TMG1 or TMG2, the timing margin of the memory device 50 or 60 may be calibrated adaptively and efficiently without errors and without stopping the operation of the memory device 50 or 60.

As will be described with reference to FIG. 3, the power level referred to in this disclosure may be represented by at least one of an operating voltage and an operating frequency. In other words, the power level may be altered by changing at least one of the operating voltage and the operating frequency. The operating voltage may be a power supply voltage of the memory device and the operating frequency may be a frequency of a clock signal of the memory device.

The power management unit 30 may monitor the operating status or the operating condition such as the workload, the operating temperature, etc., of the integrated circuit 10 to determine the operating power level corresponding to the present operating condition. For example, when the workload of the integrated circuit 10 increases, the power management unit 30 may raise the operating power level to increase the operating voltage and/or the operating frequency. In contrast, when the workload of the integrated circuit 10 decreases, the power management unit 30 may lower the operating power level to decrease the operating voltage and/or the operating frequency. When the operating temperature increases out of a normal operation range, the operating power level may be decreased to decrease the operating voltage and/or the operating frequency. The performance of the integrated circuit 10 may be enhanced by increasing the operating power level and unnecessary power consumption may be prevented by lowering the operating power level. In the present exemplary embodiment, the power management unit 30 may determine the operating power level by monitoring an operating status or an operating condition (e.g., the workload) of the processor 20. However, it is understood that one or more other exemplary embodiments are not limited thereto. For example, according to another exemplary embodiment, the processor 20 may monitor its own workload and request a change of the operating power level from the power management unit 30 accordingly.

The power management unit 30 may generate a voltage control signal VCTR and a clock control signal CCTR, and the voltage control unit 70 and the clock control unit 40 may provide the operating voltage and the operating frequency corresponding to the determined operating power level in response to the generated voltage control signal VCTR and the generated clock control signal CCTR, respectively. The clock control signal CCTR may be provided by the power management unit 30 to the clock control unit 40 in order to change the operating frequency such that the clock control unit 40 does not stop outputting a clock signal during a change of the first operating power level.

As described above, the operating power level may be altered by changing at least one of the operating voltage and the operating frequency. In one or more exemplary embodiments, the power management unit 30 may control the power level of a portion of the integrated circuit 10 independently of the power level of another portion of the integrated circuit 10. For example, when the first memory device 50 and the second memory device 60 are included in different power domains, a first operating voltage VOP1 provided to the first memory device 50 and a second operating voltage VOP2 provided to the second memory device 60 may be controlled independently. In addition, when the first memory device 50 and the second memory device 60 are included in different clock domains, a first clock signal CLK1 provided to the first memory device 50 and a second clock signal CLK2 provided to the second memory device 60 may be controlled independently. According to an exemplary embodiment, the first operating voltage VOP1 and the second operating voltage VOP2 are provided to the first memory device 50 and the second memory device 60, respectively. However, it is understood that one or more other exemplary embodiments are not limited thereto. For example, according to another exemplary embodiment, the voltage control unit 70 may receive the voltage control signal VCTR from the power management unit 30 and supply an operating voltage to the power management unit 30, whereby the power management unit 30 provides the first operating voltage VOP1 and the second operating voltage VOP2 to the first memory device 50 and the second memory device 60, respectively. Furthermore, the power management unit 30 may generate, obtain, or determine the voltage control signal VCTR based on a determination of an operating power level for the first memory device 50, based on a determination of an operating power level for the second memory device 60, or based on a determination of operating power levels for both the first memory device 50 and the second memory device 60.

The clock control unit 40 may include at least one of a phase-locked loop (PLL), a delay-locked loop (DLL), a clock multiplier, a clock diver.

A operating voltage and a clock signal may be provided to the processor 20 and the power management unit 30 from the voltage control unit 70 and the clock control unit 40, respectively. Furthermore, it is understood that the number of memory devices may vary in various exemplary embodiments. At least one of the memory devices 50 and 60 may be included in the processor 20 or may be included in the same power domain as the processor 20.

The timing margin in this disclosure may indicate an access time and/or a cycle time of a read operation in the memory device 50 or 60. For example, when a pulse signal is associated with operation timings of the memory device 50 or 60, the access time may be adjusted by controlling the activation timing of the pulse signal and the cycle time may be adjusted by controlling the pulse width or the activation time interval of the pulse signal. A change of operating voltages VOP1 and VOP2 provided to the memory devices 50 and 60 may affect the operations of the memory devices 50 and 60. For example, the read operation of the memory device 50 or 60 may increase as the operating voltage of the memory device 50 or 60 decreases. For reading data in a memory cell, a develop time is used so that data such as electric charges are developed to a bitline after the memory cell is connected to a bitline. A sense amplifier for sensing the voltage or current of the bitline is enabled after the develop time to prevent a read error, and the develop time may be varied depending on the operating voltage. The develop time may decrease as the operating voltage increase. As described below with reference to FIG. 16, the timing margin represented by the gray code signals TMG1 and TMG2 may indicate activation timings of the sense amplifiers included in the memory devices 50 and 60, respectively.

FIG. 2 is a block diagram illustrating an example of a power management unit 30 in an integrated circuit according to an exemplary embodiment, and FIG. 3 is a diagram illustrating an example of a lookup table 31 in a power management unit 30 according to an exemplary embodiment.

Referring to FIG. 2, the power management unit 30 may include a power level determination unit (DET) 32 (e.g., power level determiner) and a storage unit 33 (e.g., storage).

The storage unit 33 may include a lookup table (LUT) 31 in which the operating voltages, the operating frequencies, and the timing margins are mapped with respect to a plurality of power levels PL1, PL2, and PL3 (e.g., predetermined power levels), as illustrated in FIG. 3. The power level determination unit 32 may monitor an operating condition to determine the operating power level corresponding to the present operating condition among the plurality of power levels PL1, PL2 and PL3. As described above, for example, the workload of the processor 20 in FIG. 1 may be provided as an operating condition or state information OSI. The power level determination unit 32 may refer to the lookup table 31 to generate the voltage control signal VCTR, the clock control signal CCTR, and the gray code signal TMG corresponding to the operating power level.

The timing margins in the lookup table 31 may be determined (e.g., predetermined) by various methods. According to an exemplary embodiment, the timing margins may be determined through a test before shipment of the integrated circuit 10 as a product. According to another exemplary embodiment, the timing margins may be determined using a built-in self-test circuit (BIST) in the integrated circuit 10 before shipment. The determined timing margins may be stored in a nonvolatile storage with values of the operating voltage and the operating frequency in a form of a lookup table. Even though the timing margins are represented in decimal values in FIG. 3, it is understood that one or more other exemplary embodiments are not limited thereto. For example, according to another exemplary embodiment, the timing margins may be stored in a form of binary code of a gray code.

FIG. 4 is a diagram illustrating relation between binary codes and gray codes.

FIG. 4 illustrates the binary codes and the gray codes corresponding to decimal values from 0 to 15. The gray code has no weights for the respective bits and thus the gray code may not be appropriate for mathematical calculations. However, the gray code has a feature that only one bit is changed between consecutive gray code values. For example, when the code value or the decimal is changed by 1 from 3 to 4, only one bit of the gray code is changed whereas the three bits of the binary code are changed.

The timing margin of the memory device 50 or 60 may be calibrated adaptively and efficiently without errors and without stopping the operation of the memory device 50 or 60, by providing the timing margin using the gray code. When the power management unit 30 changes the operating power level, the power management unit 30 changes a logic level of one of the gray bit signals in the gray code signal TMG at each time to raise or lower the operating power level gradually level-by-level.

Figure 5:
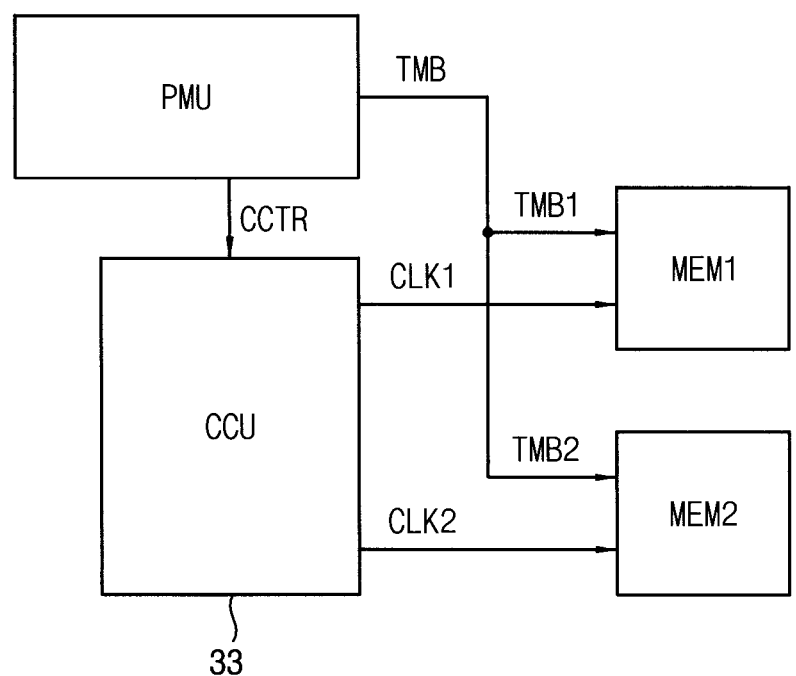
FIG. 5 is a block diagram illustrating an integrated circuit including a memory device receiving a binary code signal.
Figure 6:
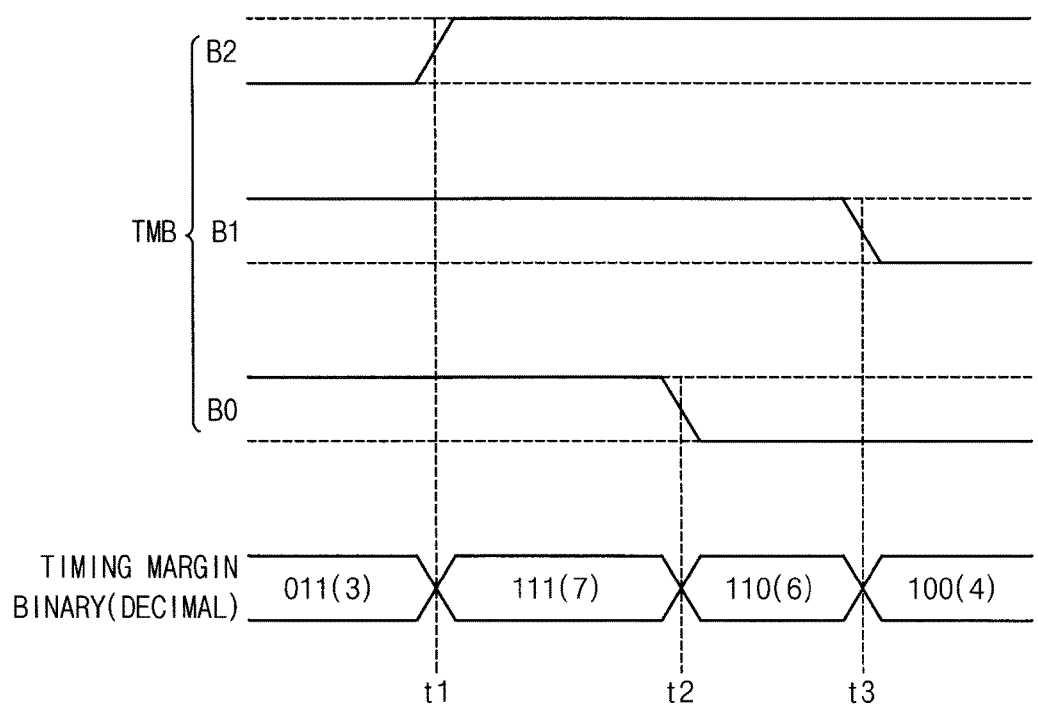
FIG. 6 is a timing diagram illustrating an operation of a memory device receiving a binary signal.

FIG. 5 is a block diagram illustrating an integrated circuit 110 including a memory device receiving a binary code signal, and FIG. 6 is a timing diagram illustrating an operation of a memory device receiving a binary signal.

Referring to FIG. 5, an integrated circuit 110 may include a power management unit PMU (e.g., power manager), a clock control unit CCU 33 (e.g., clock controller), a first memory device MEM1, and a second memory device MEM2.

The power management PMU unit may determine an operating power level corresponding to a present operating condition and generate a clock control signal CCTR and binary code signal TMB indicting a timing margin corresponding to the determined operating power level. The clock control unit CCU 33 controls clock signals CLK1 and CLK2 provided to the memory devices MEM1 and MEM2, respectively, based on the clock control signal CCTR.

The binary code signal TMB from the power management unit PMU may include a first binary code signal TMB1 provided to the first memory device MEM1 and a second binary code signal TMB2 provided to the second memory device MEM2. The first binary code signal TMB1 and the second binary code signal TMB2 may be identical signals or different signals that may be changed independently. For example, the power management unit PMU may output the same signal to both the first memory device MEM1 and the second memory device MEM2.

The memory device operates with a higher timing margin at a relatively lower power level and operates with a lower timing margin at a relatively higher power level. In other words, the timing margin of the memory device may be decreased when the operating power level is raised, and the timing margin of the memory device may be increased when the operating power level is lowered.

FIG. 6 illustrates an example case where the timing margin is increased from 3 to 4 using the binary code signal TMB including a plurality of binary bit signals B0, B1, and B2. The memory device may receive the binary bit signals B0, B1, and B2 having the skews as illustrated in FIG. 6, and operation errors may be caused by the distorted timing margins 7 and 6 during the time interval t1 through t3. The transition time points of the binary bit signals B0, B1, and B2 may be different in view of the memory device because of the different characteristics of transfer paths for the binary bit signals B0, B1 and B2, and the differences of the transition time points correspond to the skews. In general, the memory device receives a signal by sampling the signal in synchronization with rising and/or falling edges of a clock signal. The memory device may receive the wrong value of 7 if the memory device samples the binary bit signals B0, B1, and B2 between the time interval t1 through t2, and memory device may receive the wrong value of 6 if the memory device samples the binary bit signals B0, B1, and B2 between the time interval t2 through t3. To prevent such operation errors due to sampling of the wrong values of the timing margin, additional synchronizing circuits may be used or the clock signal may be stopped or deactivated during the time interval for changing the timing margin.

In a simple structure using a small number of clock signals, the clock-stop scheme may be adopted in spite of degradation of performance. In case of a complex clock structure where one intellectual property (IP) operates by selecting one of multiple clock sources according to an operating scenario of the integrated circuit including the IP, the power management unit determines which clock source has to be enabled and which clock sources have be disabled at each time point of changing the power level and the timing margin. Accordingly the clock-stop scheme causes various problems as the number of clock sources increases.

Related art semiconductor products such as related art mobile application processors perform with low power consumption. Accordingly, the range of dynamic voltage and frequency scaling (DVFS) are to be extended to reduce power consumption, but the reduction of the operating voltage may be limited by the operational characteristics of the embedded memory device, such as a static random access memory (SRAM). The synchronization problem due to the skews as illustrated in FIG. 6 may be solved according to one or more exemplary embodiments, and the range of DVFS may be extended using the timing control function of the embedded SRAM without degrading the performance of the integrated circuit.

Figure 7:
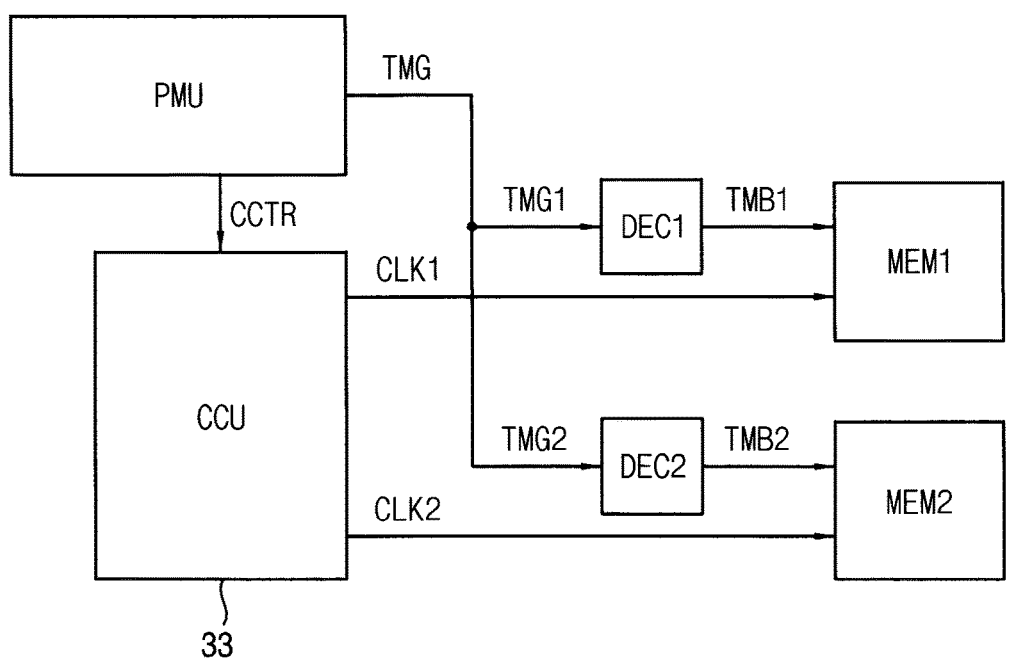
FIG. 7 is a block diagram illustrating an integrated circuit including a memory device receiving a gray code signal according to an exemplary embodiment.

FIG. 7 is a block diagram illustrating an integrated circuit 120 including a memory device receiving a gray code signal according to an exemplary embodiment, and FIGS. 8A and 8B are timing diagrams illustrating an operation of a memory device receiving a gray code signal according to an exemplary embodiment.

Referring to FIG. 7, an integrated circuit 120 may include a power management unit PMU (e.g., power manager), a clock control unit CCU 33 (e.g., clock controller), a first decoder DEC1, a second decoder DEC2, a first memory device MEM1, and a second memory device MEM2.

The power management unit PMU may determine or obtain an operating power level corresponding to a present operating condition and generate a clock control signal CCTR and a gray code signal TMG indicating the timing margin of the determined operating power level. The clock control unit CCU may control clock signals CLK1 and CLK2 provided to the memory devices MEM1 and MEM2, respectively, based on the generated clock control signal CCTR.

Even though FIG. 7 illustrates that the decoders DEC1 and DEC2 are disposed before the memory devices MEM1 and MEM2 (i.e., between the power management unit PMU and the memory devices MEM1 and MEM2), the decoders DEC1 and DEC2 may be disposed or included in the memory devices MEM1 and MEM2, respectively. The decoders DEC1 and DEC2 may receive the gray code signals TMG1 and TMG2, respectively, from the power management unit PMU and convert the gray code signals TMG1 and TMG2 to binary code signals TMB1 and TMB2. An example configuration of the decoders DEC1 and DEC2 will be described below with reference to FIG. 13. The gray code signal TMG provided from the power management unit PMU may include the first gray code signal TMG1 for the first memory device MEM1 and the second gray code signal TMG2 for the second memory device MEM2. The first gray code signal TMG1 and the second gray code signal TMG2 may be identical signals or different signals that may be changed independently.

FIG. 8A illustrates an example case where the timing margin is increased from 3 to 4 using the gray code signal TMG including a plurality of gray bit signals G0, G1, and G2. At time t0, only one gray bit signal G2 transitions. Even though there are characteristic differences of the transfer paths for the gray bit signals G0, G1, and G2, the skews between the binary bit signals B0, B1, and B2 as described above with reference to FIG. 6 is not caused between the gray bit signals G0, G1, and G2, and thus the operation errors during the change of the timing margin may be prevented.

When the timing margin is provided using the gray code signal, the synchronization problem does not occur between the gray bit signals included in the gray code signal if the timing margin is changed gradually by a value of one. In general, the adjustment of the timing margin is performed when the integrated circuit adopts the DVFS scheme, and the operating voltage is increased or decreased gradually according to the DVFS scheme. Accordingly the timing margin of the memory device is expected to change gradually according to the DVFS scheme. If the timing margin is to be changed by a value of two or more, the timing margin may be changed several times (e.g., successively) by a value of one to prevent operation errors. For example, when the timing margin is to be increased from 3 to 6, operation errors may be prevented by changing the timing margin three times as 3 to 4, 4 to 5, and 5 to 6.

Similarly, for example, if the timing margin is increased from 3 to 5, the timing margin may be increased gradually from 3 to 4 at time t0 and then from 4 to 5 at time t1 as illustrated in FIG. 8B. Even though the memory device samples the gray bit signals G0, G1, and G2 during the time interval t0 through t1, the memory device samples and receives the intermediate value of 4 between the previous value of 3 and changed value of 5, and thus operation errors may be prevented.

Figure 9:
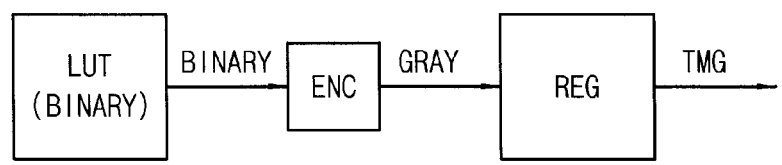
FIGS. 9 and 10 are block diagrams illustrating examples of a power management unit outputting a gray code signal according to exemplary embodiments.
Figure 10:
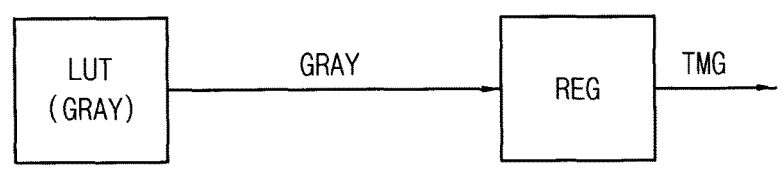

FIGS. 9 and 10 are block diagrams illustrating examples of a power management unit 35 outputting a gray code signal according to exemplary embodiments.

Referring to FIG. 9, a power management unit 35 (e.g., power manager) may include a storage unit LUT, an encoder ENC, and a register REG. Furthermore, it is understood that the power management unit may also include elements for determining the operating power level and controlling the operating voltage, the operating frequency, and/or the operating temperature. The storage unit LUT may store binary codes indicating timing margins of the power levels, respectively. The encoder ENC may receive a binary code, among the stored binary codes, indicating the timing margin of the operating power level from the storage unit LUT and convert the binary code to a gray code. An example configuration of the encoder ENC will be described below with reference to FIG. 12. The register REG may operate as an output buffer to output the gray code signal TMG based on the gray code from the encoder ENC.

Referring to FIG. 10, a power management unit 36 (e.g., power manager) according to another exemplary embodiment may include a storage unit LUT and a register REG. Furthermore, it is understood that the power management unit 36 may also include elements for determining the operating power level and controlling the operating voltage and/or the operating frequency. The storage unit LUT may store gray codes indicating timing margins of the power levels, respectively. The register REG may receive a gray code, among the stored gray codes, indicating the timing margin of the operating power level from the storage unit REG and operate as an output buffer to output the gray code signal TMG based on the gray code from the storage unit REG.

As such, the power management unit 35 and 36 according to various exemplary embodiments may provide the timing margin to the memory device using the gray code. Accordingly, the timing margin of the memory device may be calibrated adaptively and efficiently with preventing errors and without stopping the operation of the memory device.

Figure 11:
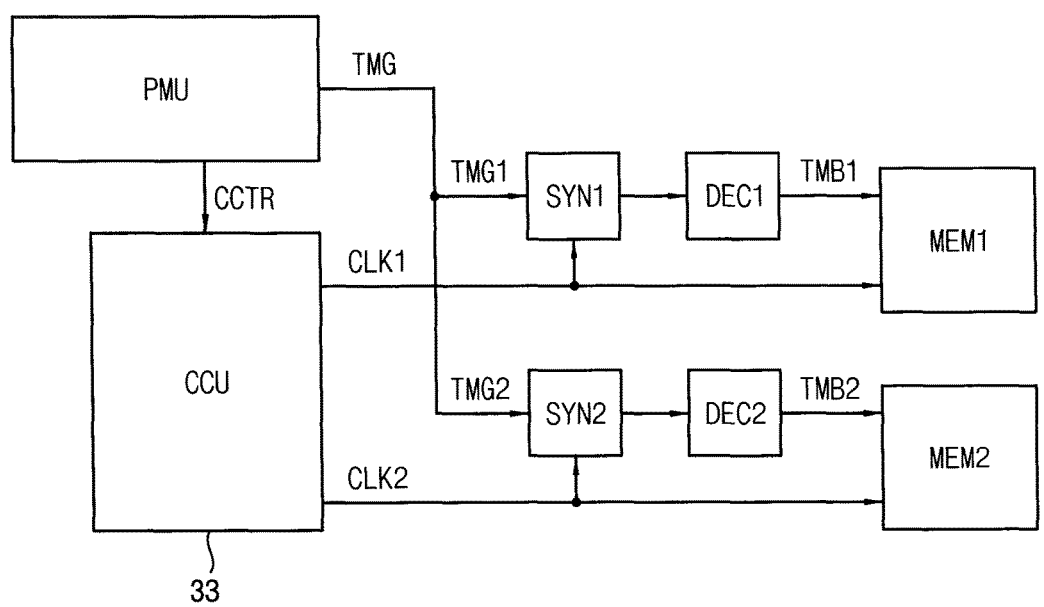
FIG. 11 is a block diagram illustrating an integrated circuit including a memory device receiving a gray code signal according to an exemplary embodiment.

FIG. 11 is a block diagram illustrating an integrated circuit 130 including a memory device receiving a gray code signal according to an exemplary embodiment.

Referring to FIG. 11, an integrated circuit 130 may include a power management unit PMU (e.g., power manager), a clock control unit CCU 33 (e.g., clock controller), a first synchronization circuit SYN1, a second synchronization circuit SYN2, a first decoder DEC1, a second decoder DEC2, a first memory device MEM1, and a second memory device MEM2.

The power management unit PMU may determine an operating power level corresponding to a present operating condition and generate a clock control signal CCTR and a gray code signal TMG indicating the timing margin of the operating power level. The clock control unit CCU may control clock signal CLK1 and CLK2 provided to the memory devices MEM1 and MEM2, respectively, based on the clock control signal CCTR.

As compared to the exemplary embodiment illustrated in FIG. 7, the integrated circuit 130 of FIG. 11 further includes the synchronization circuits SYN1 and SYN2 disposed before the decoders DEC1 and DEC2, respectively (i.e., disposed between the power management unit PMU and the decoders DEC1 and DEC2, respectively). The synchronization circuits SYN1 and SYN2 may synchronize the gray code signals TMG1 and TMG2 received from the power management unit PMU to provide the synchronized gray code signals to the decoders DEC1 and DEC2, respectively. The synchronization circuits SYN1 and SYN2 and the decoders DEC1 and DEC2 may be disposed or included before the memory devices MEM1 and MEM2, as described above, or may be disposed or included in the memory devices MEM1 and MEM2, respectively. The decoders DEC1 and DEC2 may receive the synchronized gray code signals TMG1 and TMG2, respectively, from the synchronization circuits SYN1 and SYN2 and convert the gray code signals TMG1 and TMG2 to binary code signals TMB1 and TMB2. The gray code signal TMG provided from the power management unit PMU may include the first gray code signal TMG1 for the first memory device MEM1 and the second gray code signal TMG2 for the second memory device MEM2. The first gray code signal TMG1 and the second gray code signal TMG2 may be identical signals or different signals that may be changed independently.

As described above with reference to FIGS. 8A and 8B, the skews between the binary bit signals B0, B1, and B2 as illustrated in FIG. 6 may not be caused between the gray bit signals G0, G1, and G2, and thus the operation errors during the change of the timing margin may be prevented.

Figure 12:
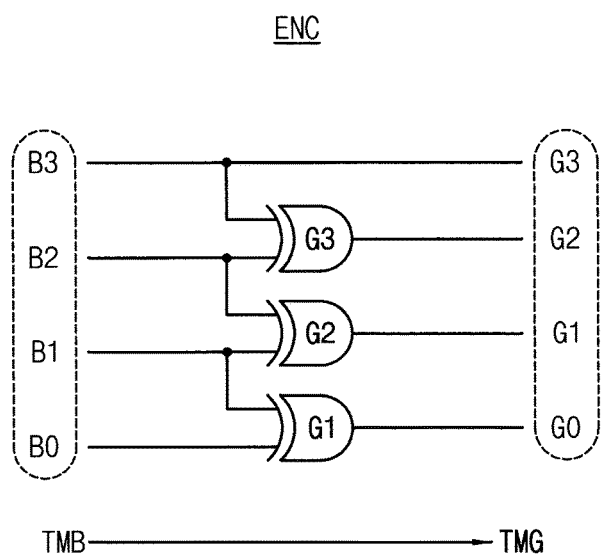
FIG. 12 is a circuit diagram illustrating an example of an encoder configured to convert a binary code signal to a gray code signal according to an exemplary embodiment.

FIG. 12 is a circuit diagram illustrating an example of an encoder ENC configured to convert a binary code signal to a gray code signal according to an exemplary embodiment.

Referring to FIG. 12, an encoder ENC may include a plurality of exclusive OR (XOR) gates XG1, XG2, and XG3 configured to convert a binary code signal TMB including a plurality of binary bit signal B0, B1, B2, and B3 to a gray code signal TMG including a plurality of gray bit signals G0, G1, G2, and G3.

The fourth binary bit signal B3 corresponds to the fourth gray bit signal G3, that is, the most significant bit signal. The third XOR gate XG3 performs an XOR operation on the fourth binary bit signal B3 and the third binary bit signal B2 to output the third gray bit signal G2. The second XOR gate XG2 performs an XOR operation on the third binary bit signal B2 and the second binary bit signal B1 to output the second gray bit signal G1. The first XOR gate XG1 performs an XOR operation on the second binary bit signal B1 and the first binary bit signal B0 to output the first gray bit signal G0, that is, the least significant signal.

As such, the power management unit 35 in FIG. 9 may include the encoder ENC configured to perform XOR operations on the binary code bit signals B0, B1, B2, and B3 indicating the timing margin of the operating power level to provide the gray bit signals G0, G1, G2, and G3 in the gray code signal TMG.

Figure 13:
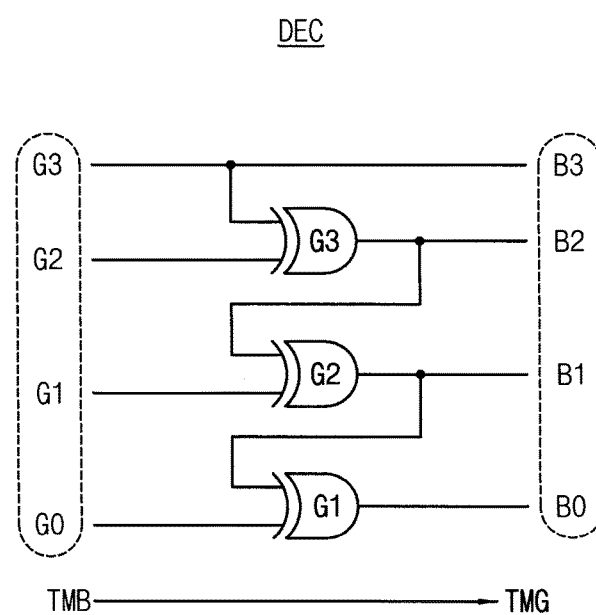
FIG. 13 is a circuit diagram illustrating an example of a decoder configured to convert a gray code signal to a binary code signal according to an exemplary embodiment.

FIG. 13 is a circuit diagram illustrating an example of a decoder DEC configured to convert a gray code signal to a binary code signal according to an exemplary embodiment.

Referring to FIG. 13, a decoder DEC may include a plurality of exclusive OR (XOR) gates XG1, XG2, and XG3 configured to convert a gray code signal TMG including a plurality of gray bit signals G0, G1, G2, and G3 to a binary code signal TMB including a plurality of binary bit signal B0, B1, B2, and B3.

The fourth gray bit signal G3 corresponds to the fourth binary bit signal B3, that is, the most significant bit signal. The third XOR gate XG3 performs an XOR operation on the fourth gray bit signal G3 and the third gray bit signal G2 to output the third binary bit signal B2. The second XOR gate XG2 performs an XOR operation on the output of the third XOR gate XG3 and the second gray bit signal G1 to output the second binary bit signal B1. The first XOR gate XG1 performs an XOR operation on the output of the second XOR gate XG2 and the first gray bit signal G0 to output the first binary bit signal B0, that is, the least significant signal.

Figure 14:
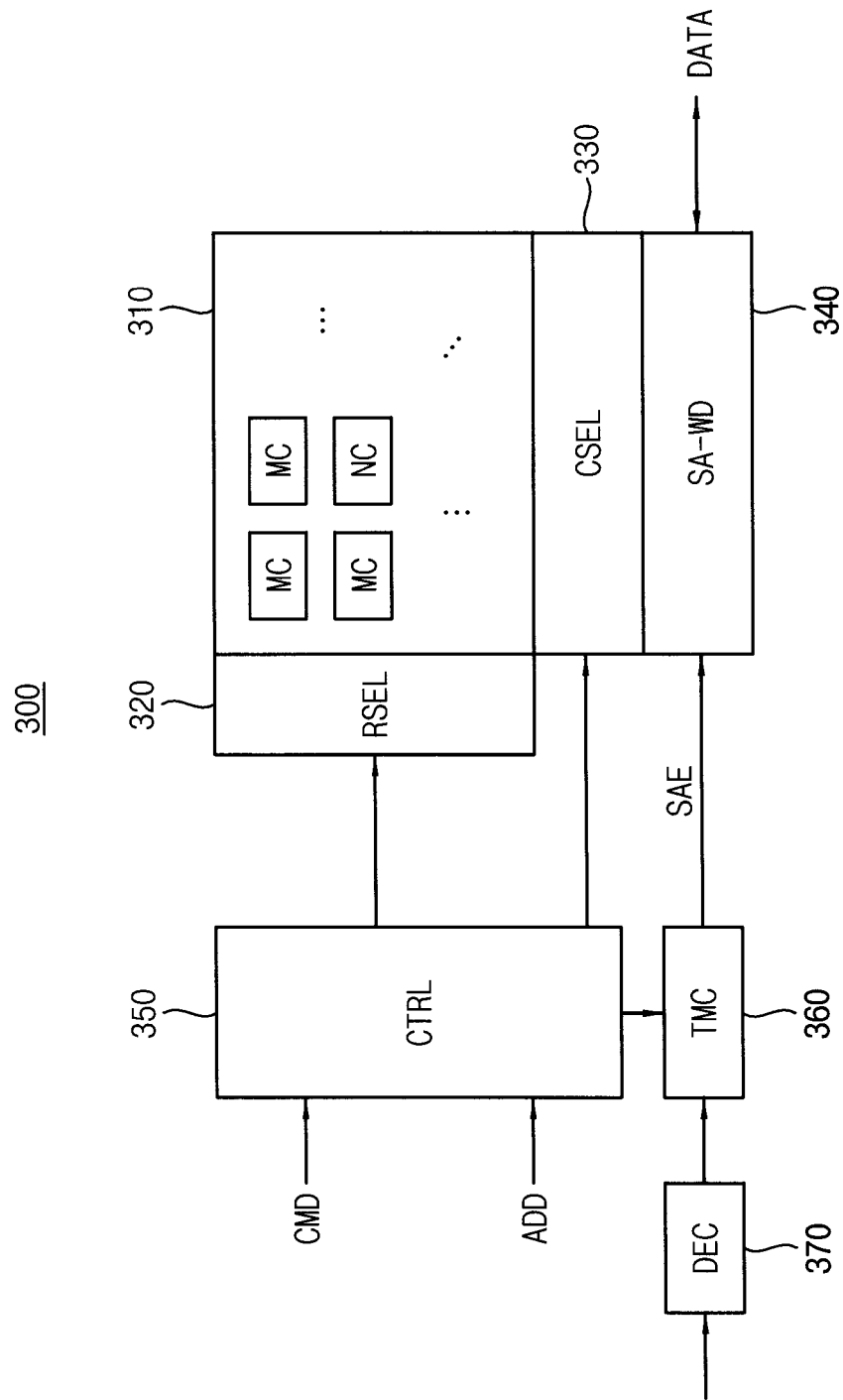
FIG. 14 is a block diagram illustrating a memory device according to an exemplary embodiment.

FIG. 14 is a block diagram illustrating a memory device 300 according to an exemplary embodiment.

Referring to FIG. 14, a memory device 300 may include a memory core and a controller (CTRL) 350. The memory core may include a memory cell array 310 and peripheral circuits such as a row selection circuit (RSEL) 320, a column selection circuit (CSEL) 330, and a sense amp and word driver (SA-WD) circuit 340. A timing margin control unit (TMC) 360 (e.g., timing margin controller) and/or a decoder (DEC) 370 may be included in the controller 350 or may be disposed outside of (e.g., before) the memory device 300.

Figure 15:
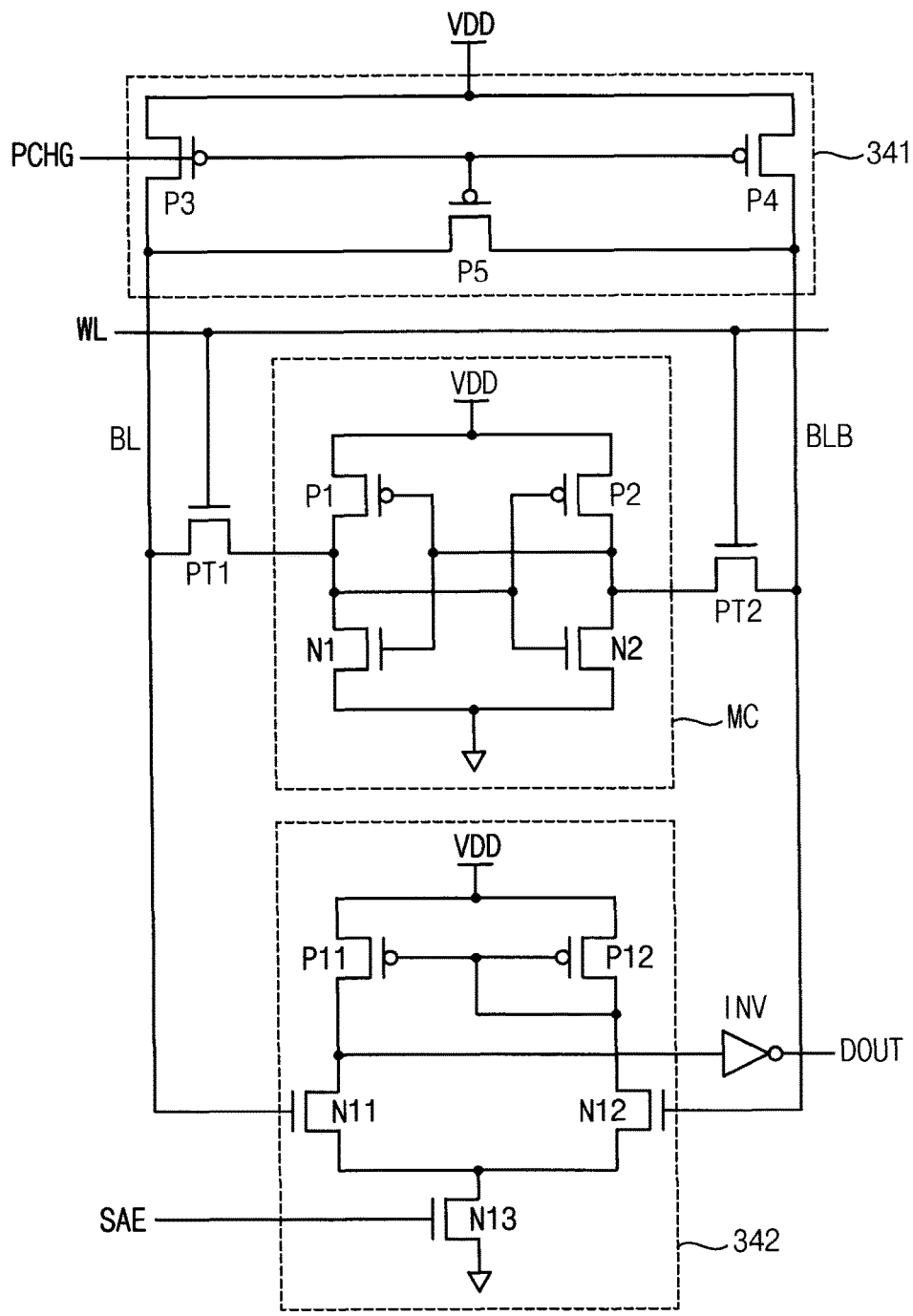
FIG. 15 is a circuit diagram illustrating a static random access memory (SRAM) device according to an exemplary embodiment.

The memory cell array 310 may include a plurality of memory cells MCs that are coupled to wordlines and bitlines, respectively, and arranged in a matrix form. For example, the memory cell MC may be an SRAM cell as illustrated in FIG. 15. The sense amp and word driver circuit 340 may include sense amplifiers 342 as illustrated in FIG. 15. Each sense amp amplifier 342 may perform a sensing operation to latch a data bit on the corresponding bitline in response to a sense amp enable signal SAE from the timing margin control unit 360.

As described above, the decoder 370 may receive a gray code signal each time an operating power level is determined to be changed. The decoder 370 may convert the gray code signal TMG, which is provided from the power management unit PMU, to the binary code signal. Furthermore, according to one or more exemplary embodiments, whenever the decoder 370 receives sequential gray code signals indicating a change in the timing margin, the sequential gray code signals differ in only one bit. The timing margin control unit 360 may determine an activation timing of the sense amplifier 342 based on the timing margin indicated by the binary code signal TMB. In an exemplary embodiment, the timing margin control unit 360 may be implemented with a variable delay circuit. The variable delay circuit may delay an internal signal provided from the controller 350 by a delay time corresponding to the timing margin in response to the binary code signal TMB to output the sense amp enable signal SAE. Even though FIG. 14 illustrates the timing margin control unit 360 distinct from the controller 350, it is understood that one or more other exemplary embodiments are not limited thereto. For example, according to another exemplary embodiment, the timing margin control unit 360 may be included in the controller 350.

The controller 350 may control overall operations of the memory device 300 based on a command signal CMD and an address signal ADD input or received from an external device such as a memory controller. The row selection circuit 320 and the column selection circuit 330 may perform operations for accessing the memory cells MC in the memory cell array 310 based on control signals and internal address signals from the controller 350. Additionally, it is understood that the controller 350 and/or other components of the memory device 300 receives a clock signal and controls an operation timing of the memory device 300 based on the clock signal. Here, the controller 350 may be configured to continuously receive the clock signal having an operation frequency when the operating power level is changed, and to control the operation timing based on the clock signal.

FIG. 15 is a circuit diagram illustrating a static random access memory (SRAM) device according to an exemplary embodiment.

Referring to FIG. 15, an SRAM device may include a memory cell MC, a precharge/equalization circuit 341, and a sense amplifier 342. For example, the memory cell MC may be a one-port SRAM cell of four transistors. The memory cell MC may include a first inverter including a p-type metal oxide semiconductor (PMOS) transistor P1 and an n-type metal oxide semiconductor (NMOS) transistor N1 and a second inverter including a PMOS transistor N2 and an NMOS transistor N2. The output of the first inverter is coupled to the input of the second inverter and the output of the second inverter is coupled to the input of the first inverter. The memory cell MC may be coupled to the bitline pair BL and BLB through pass transistors PT1 and PT2, the gates of which are coupled to a wordline WL. When a selection voltage is applied to the wordline WL, the pass transistors PT1 and PT2 are turned on and the memory cell MC is electrically coupled to the bitline pair BL and BLB. A plurality of memory cells of the same column may be coupled to the bitline pair BL and BLB, although one memory cell MC is illustrated in FIG. 15 for convenience of illustration. The driving voltages applied to the memory cell MC, the precharge/equalization circuit 341, and the sense amplifier 342 may be the same voltage VDD as illustrated in FIG. 15. However, it is understood that one or more other exemplary embodiments are not limited thereto. For example, according to another exemplary embodiment, the memory cell MC, the precharge/equalization circuit 341, and the sense amplifier 342 may be driven or powered by the different voltages.

The precharge/equalization circuit 341 may precharge and equalize the bitline pair BL and BLB in response to a precharge control signal PCHG. The precharge/equalization circuit 341 may precharge the bitline pair BL and BLB by applying the voltage VDD to the bitline pair BL and BLB through PMOS transistors P3 and P4. The precharge/equalization circuit 341 may perform the equalization by coupling the bitline pair BL and BLB through a PMOS transistor P5.

The sense amplifier 342 may detect voltages on the bitline pair BL and BLB to sense data stored in the memory cell. The sense amplifier 342 may include PMOS transistors P11 and P12 and NMOS transistors N11, N12, and N13. An inverter INV may be coupled to a common drain of the PMOS transistor P11 and the NMOS transistor N11. A common gate of the PMOS transistor P11 is coupled to a common drain of the PMOS transistor P12 and the NMOS transistor N12. A common source of the NMOS transistors N11 and N12 may be selectively coupled to a ground voltage through the NMOS transistor N13. When the sense amp enable signal SAE is activated, the common source of the NMOS transistors N11 and N12 is coupled to the ground voltage and the sensing operation of the sense amplifier 342 is enabled.

Figure 16:
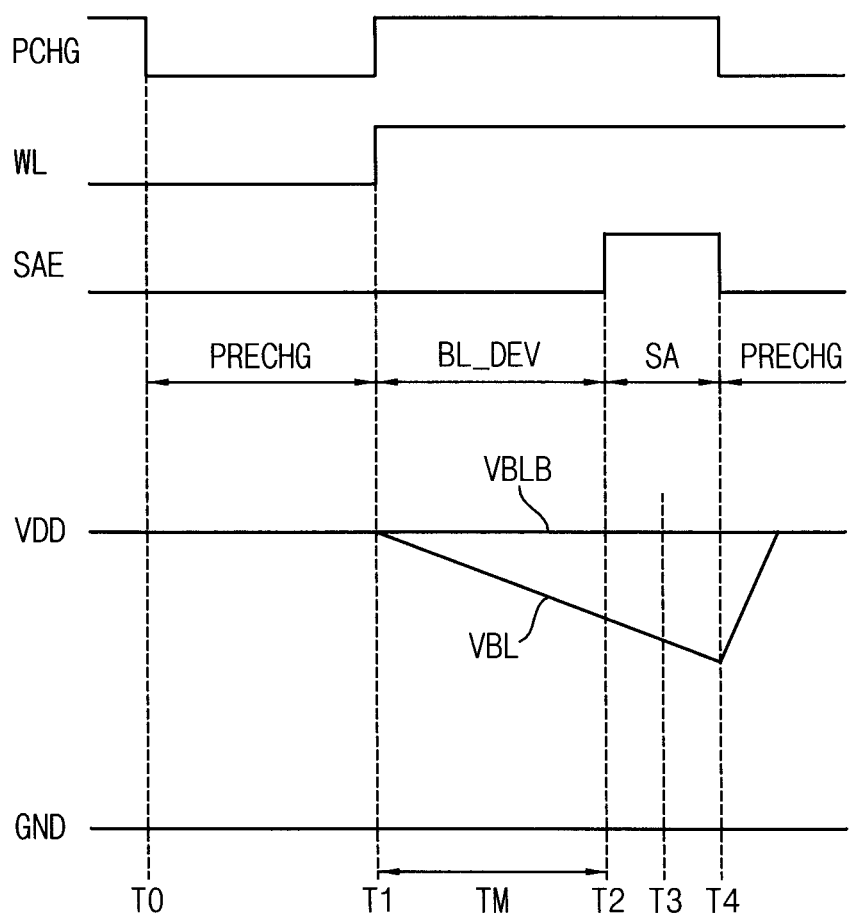
FIG. 16 is a timing diagram illustrating an operation of an SRAM device according to an exemplary embodiment.

FIG. 16 is a timing diagram illustrating an operation of the SRAM device of FIG. 15 according to an exemplary embodiment.

Referring to FIGS. 15 and 16, at a time point T0, the bitline precharge operation is performed. When the precharge control signal PCHG is activated or asserted in a logic low level, the PMOS transistors P3, P4, and P5 in the precharge/equalization circuit 341 are turned on and the bitline pair BL and BLB is precharged and equalized with the voltage VDD.

At a time point T1, the precharge control signal PCHG is deactivated in a logic high level, and the selected wordline WL is activated in a logic high level. The PMOS transistors P3, P4, and P5 in the precharge/equalization circuit 341 are turned off, and the pass transistors PT1 and PT2 are turned on to couple the selected memory cell MC to the bitline pair BL and BLB. The data stored in the memory cell MC is transferred and developed to the bitline pair BL and BLB through the pass transistors PT1 and PT2 that are turned on.

For example, if the memory cell MC stores a logic low value, the voltage VBL of the bitline BL may be decreased by the development or charge sharing between the memory cell MC and the bitline BL and the complementary bitline BLB may maintain the precharged voltage VDD.

At a time point T2, the sense amp enable signal SAE is activated in a logic high level and the sense amplifier 342 is enabled to perform the sensing operation. The sensing operation of the sense amplifier 342 may be based on a voltage difference between the bitline pair BL and BLB. For example, the above-described timing margin may correspond to a time interval between the time point T1 when the bitline development BL_DEV begins and the time point T2 when the sensing operation SA begins. As described above with reference to FIG. 14, the timing margin may be represented as the delay time of the sense amp enable signal SAE by the timing margin control unit 360.

For example, when an operating voltage or a power supply voltage VDD is decreased according to a change of an operating condition, the voltage difference between the bitline pair BL and BLB may not be sufficient by a first timing margin TM1 between the time points T1 and T2. In this case, the first timing margin TM1 is increased to a second timing margin between the time points T1 and T3 to provide sufficient voltage difference at the enable timing of the sense amplifier 342. As described above, the timing margin may be provided to the memory device using the gray code signal according to one or more exemplary embodiments. Thus, the timing margin of the memory device may be calibrated adaptively and efficiently while preventing errors and without stopping an operation of the memory device.

At a time point T4, the precharge control signal PCHG is activated in a logic low level, the wordline is deactivated in a logic high level, and the sense amp enable signal SAE is deactivated in a logic low level. The pass transistors PT1 and PT2 are turned off and the bitline precharge operation begins again.

Figure 17:
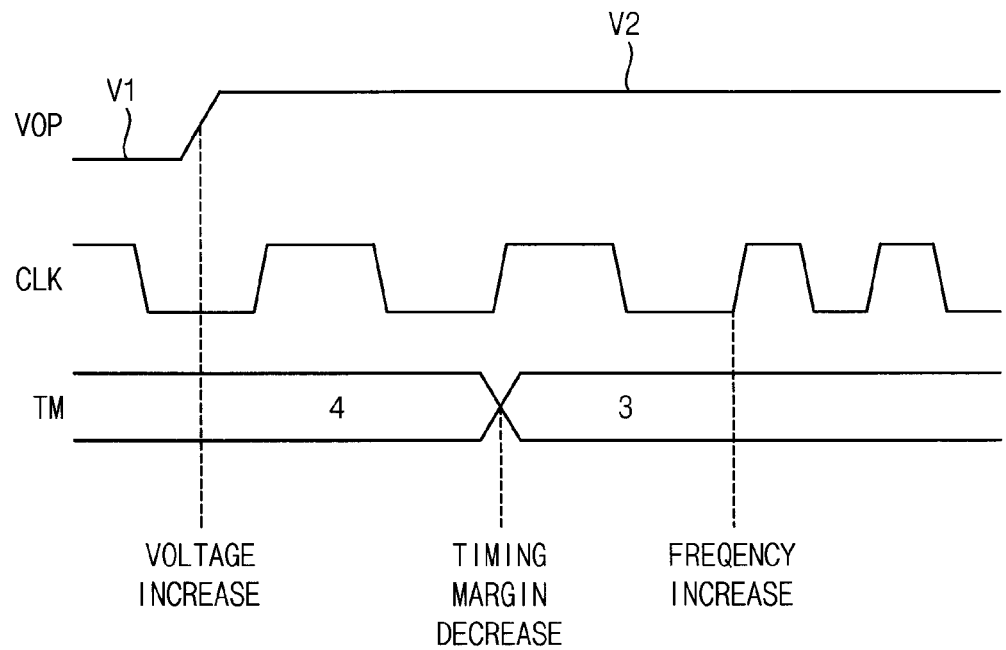
FIG. 17 is a timing diagram illustrating a sequence of raising a power level according to an exemplary embodiment.
Figure 18:
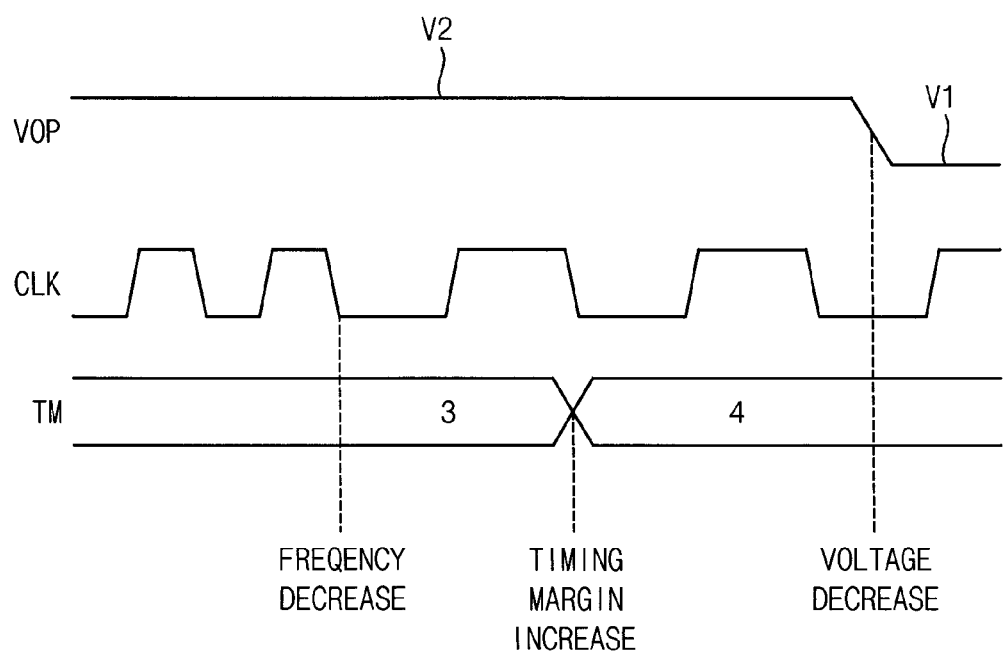
FIG. 18 is a timing diagram illustrating a sequence of lowering a power level according to an exemplary embodiment.

FIG. 17 is a timing diagram illustrating a sequence of raising a power level according to an exemplary embodiment, and FIG. 18 is a timing diagram illustrating a sequence of lowering a power level according to an exemplary embodiment.

Referring to FIG. 17, when the operating power level is raised, the power management unit PMU may increase an operating voltage (e.g., from V2 to V1), decrease the timing margin (e.g., from 4 to 3) after increasing the operating voltage, and increase an operating frequency after decreasing the timing margin. Referring to FIG. 18, when the operating power level is lowered, the power management unit PMU may decrease the operating frequency, increase the timing margin (e.g., from 3 to 4) after decreasing the operating frequency, and decrease the operating voltage (e.g., from V1 to V2) after increasing the timing margin.

As described above with reference to FIG. 6, if the wrong value of the timing margin is used temporarily or the timing margin is not proper for the operating voltage and/or the operating frequency, operation errors may be caused. When the operating power level is raised, the timing margin is to be decreased before increasing the operating frequency and after increasing the operating voltage. For example, if the operating frequency is increased before the timing margin is decreased, a setup time violation may occur such that the data processing is impossible in the predetermined clock cycle because the memory device operates based on the low-speed timing margin when the operating frequency is increased. For at least similar reasons, the timing margin is to be increased after decreasing the operating frequency and before decreasing the operating voltage, when the operating power level is lowered.

Figure 19:
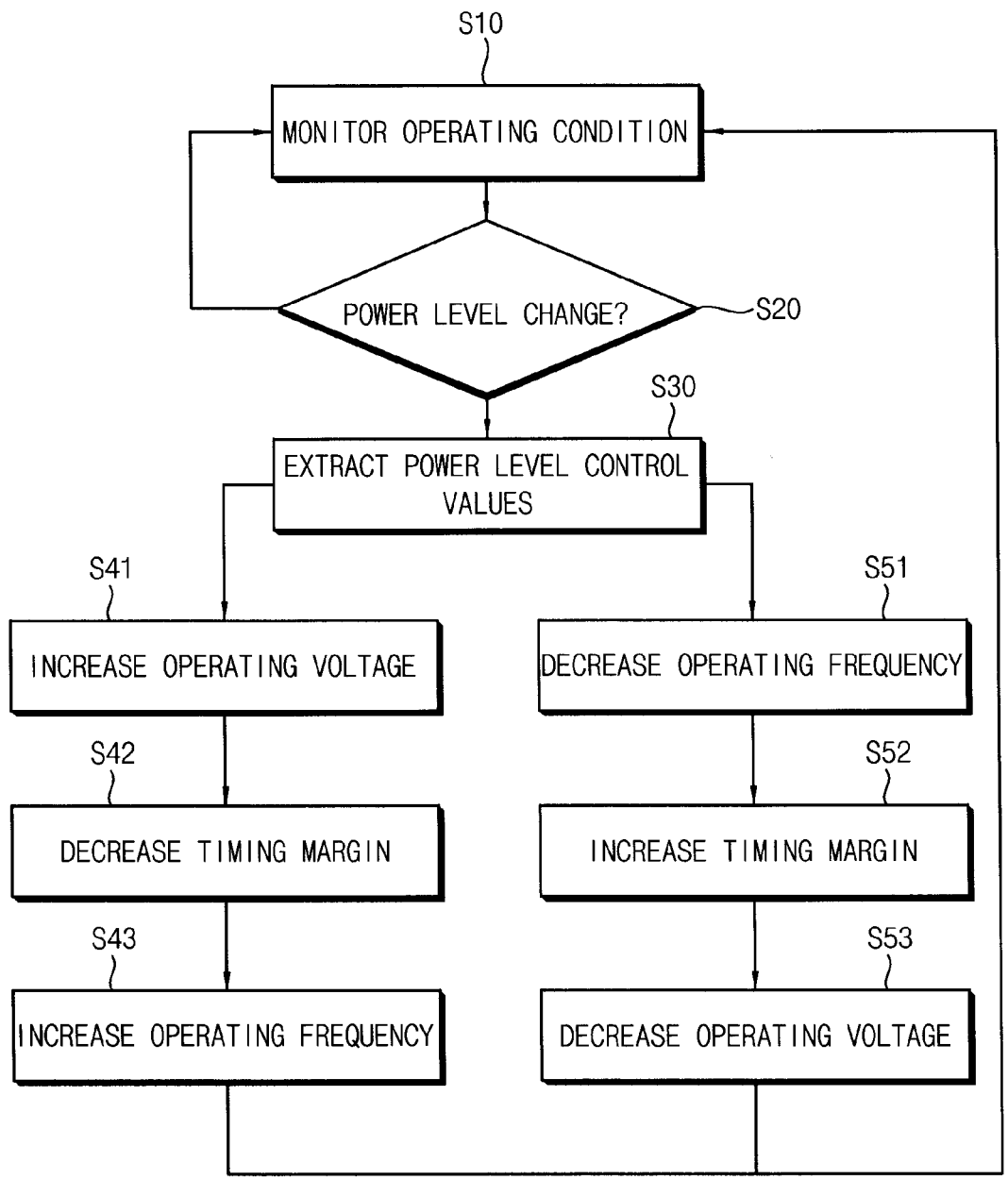
FIG. 19 is a flowchart illustrating a power management method according to an exemplary embodiment.

FIG. 19 is a flowchart illustrating a power management method according to an exemplary embodiment.

Referring to FIG. 19, a power management unit PMU (e.g., power manager) monitors at least one of an operating condition and an operating state (operation S10). When the operating power level is to be changed (operation S20: YES) (e.g., as determined based on the monitored operating condition and/or operating state), the power management unit PMU extracts power level control values (operation S30). For example, the power level control values may include a timing margin, an operating voltage, and an operating frequency. When the power level is raised, as described above with reference to FIG. 17, the power manager management unit PMU increases the operating voltage (operation S41), decreases the timing margin (operation S42), and then increases the operating frequency (operation S43). When the power level is lowered, as described above with reference to FIG. 18, the power manager management unit PMU decreases the operating frequency (operation S51), increases the timing margin (operation S52), and then decreases the operating voltage (operation S53).

According to one or more exemplary embodiments, the timing margin may be provided from the power management unit PMU to the memory device using the gray code signal TMG. The timing margin of the memory device may be calibrated adaptively and efficiently while preventing errors, which may be caused while increasing or decreasing the timing margin, and without stopping the operation of the memory device.

Figure 20:
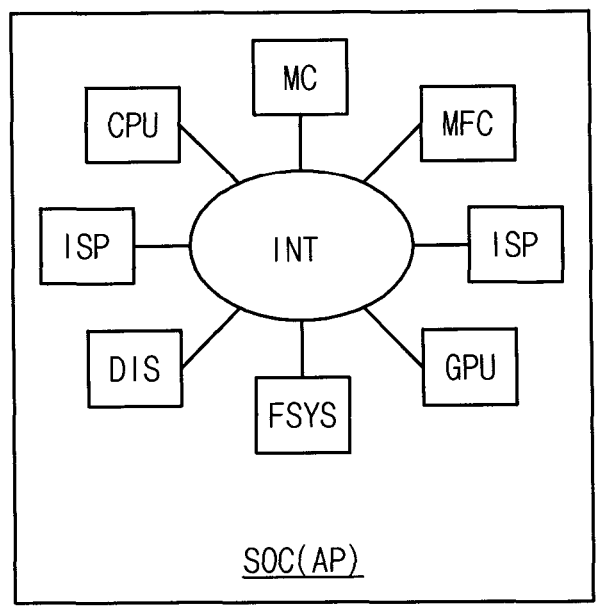
FIG. 20 is a block diagram illustrating a system on chip according to an exemplary embodiment.

FIG. 20 is a block diagram illustrating a system on chip according to an exemplary embodiment.

Referring to FIG. 20, a system on chip (SOC) may be an application processor (AP) chip in which a plurality of intellectual properties or function blocks are coupled through an interconnection device INT. For example, the intellectual properties may include a power management unit (PMU) (e.g., power manager), a memory controller (MC), a central processing unit (CPU), a display controller (DIS), a file system block (FSYS), a graphic processing unit (GPU), an image signal processor (ISP), a multi-format codec block (MFC), etc.

Furthermore, it is understood that one or more intellectual properties may include an embedded memory device such as an SRAM device. As described above, the power management unit PMU may provide the timing of the SRAM device using a gray code signal. At least some operations of the power management unit PMU may be implanted or stored in a form of program codes that may be readable and executable by a computer or a processing unit. The program codes may be provided to the central processing unit CPU and may be executed by the central processing unit CPU.

Figure 21:
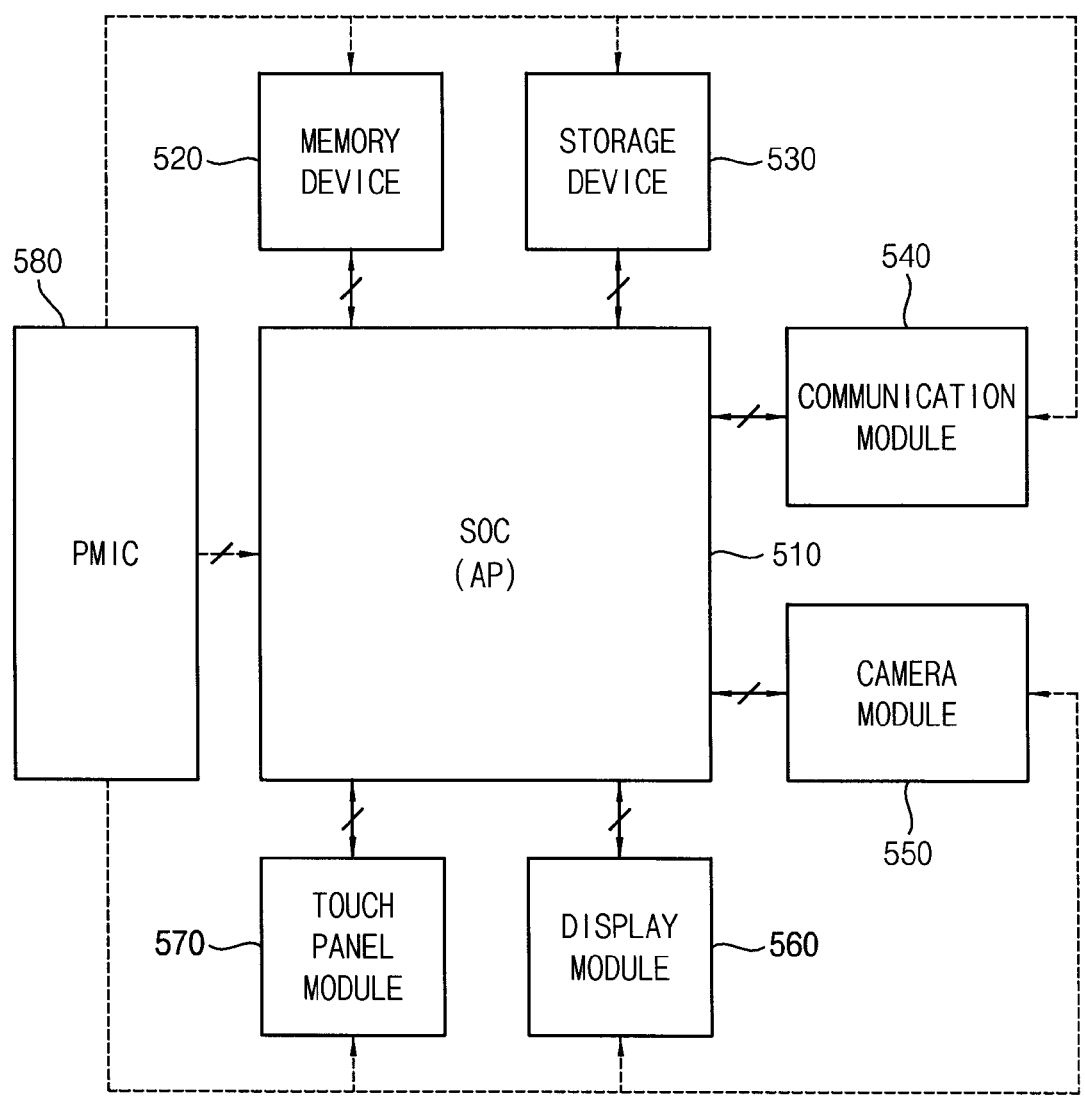
FIG. 21 is a block diagram illustrating a mobile device according to an exemplary embodiment.
Figure 22:
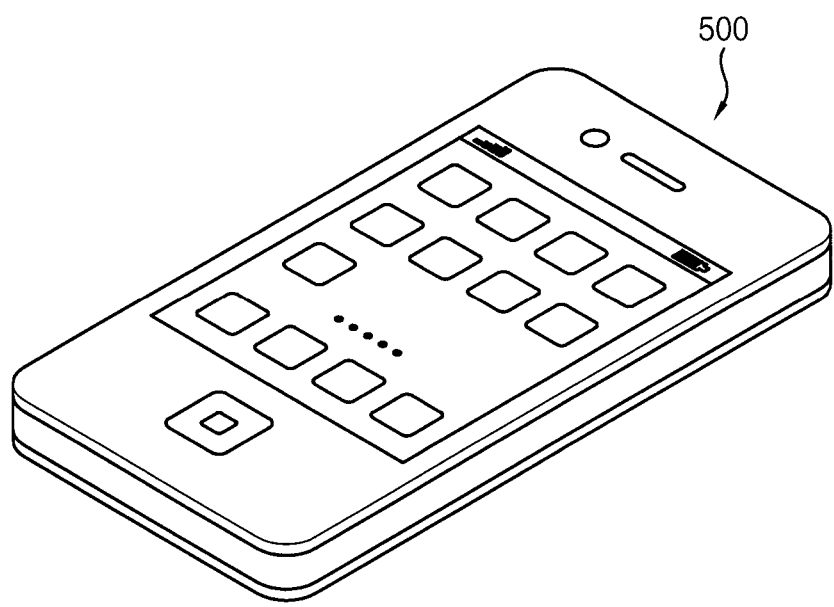
FIG. 22 is a diagram illustrating a mobile device implemented as a smart-phone according to an exemplary embodiment.

FIG. 21 is a block diagram illustrating a mobile device 500 (as an example of a portable device) according to an exemplary embodiment, and FIG. 22 is a diagram illustrating a mobile device 500 implemented as a smart phone according to an exemplary embodiment.

Referring to FIGS. 21 and 22, a mobile device 500 may include a system on-chip 510, a memory device 520, a storage device 530, a plurality of function modules 540, 550, 560, and 570, and a power management integrated circuit 580. The power management integrated circuit 580 may provide an operating voltage to the system on-chip 510, the memory device 520, the storage device 530, and the function modules 540, 550, 560, and 570, respectively. As illustrated in FIG. 22, the mobile device 500 may be implemented as a smart phone, and the system on-chip 510 may correspond to an application processor (AP). Although it is illustrated in FIG. 21 that the power management integrated circuit 580 is disposed outside the system on-chip 510, it is understood that one or more other exemplary embodiments are not limited thereto. For example, according to another exemplary embodiment, the power management integrated circuit 580 may be placed inside the system on-chip 510. The power management integrated circuit 580 may be referred to as a voltage control unit (e.g., voltage controller) as described above.

The application processor 510 may control an overall operation of the mobile device 500. That is, the application processor 510 may control the memory device 520, the storage device 530, and the function modules 540, 550, 560, and 570. Here, the application processor 510 may monitor an operating state or an operating condition of a central processing unit (CPU) included in the application processor 510, and may perform a dynamic voltage and frequency scaling (DVFS) (i.e., increase, decrease, or maintain an operating frequency of the central processing unit) based on the monitored operating condition of the central processing unit. In various exemplary embodiments, the DVFS may be performed by at least one of hardware and software.

The memory device 520 and the storage device 530 may store data for operations of the mobile device 500. In one or more exemplary embodiments, the memory device 520 and the storage device 530 may be included in the application processor 510. For example, the memory device 520 may include a volatile semiconductor memory device such as a dynamic random access memory (DRAM) device, a static random access memory (SRAM) device, a mobile DRAM, etc. In addition, the storage device 530 may include a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. In one or more exemplary embodiments, the storage device 530 may further include a solid state drive (SSD), a hard disk drive (HDD), a CD-ROM, etc. However, it is understood that the types of the memory device 520 and the storage device 530 are not limited thereto in one or more other exemplary embodiments.

The function modules 540, 550, 560, and 570 may perform various functions of the mobile device 500. For example, the mobile device 500 may include a communication module 540 (e.g., communicator) that performs a communication function (e.g., code division multiple access (CDMA) module, long term evolution (LTE) module, radio frequency (RF) module, ultra wideband (UWB) module, wireless local area network (WLAN) module, worldwide interoperability for microwave access (WIMAX) module, etc.), a camera module 550 (e.g., camera) that performs a camera function, a display module 560 (e.g., display) that performs a display function, a touch panel module 570 (e.g., touch panel) that performs a touch-input sensing function, etc. In one or more exemplary embodiments, the mobile device 500 may further include a global positioning system (GPS) module (e.g., GPS chip), a microphone (MIC) module (e.g., microphone), a speaker module (e.g., speaker), various sensor modules (e.g., a gyroscope sensor, a geomagnetic sensor, an acceleration sensor, a gravity sensor, an illumination sensor, a proximity sensor, a digital compass, etc.). However, it is understood that the types of the function modules 540, 550, 560, and 570 included in the mobile device 500 are not limited thereto in one or more other exemplary embodiments. Although it is illustrated in FIGS. 19 and 20 that the system on-chip 510 is implemented as the application processor of the mobile device 500, it is understood that one or more other exemplary embodiments are not limited thereto. For example, according to one or more other exemplary embodiments, the system on-chip 510 may correspond to any semiconductor integrated chip that includes a central processing unit on which a dynamic voltage and frequency scaling is performed.

The elements illustrated in FIGS. 7, 11, 20, and 21 may be implemented with various packaging schemes. For example, at least some elements may be implemented using Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc. For example, in an exemplary embodiment, the DRAM and an application processor may be provided in a Package on Package.

It is understood that various combinations of the above-described elements may be provided in various exemplary embodiments. For example, according to an exemplary embodiment, a portable device (e.g., a mobile device, a smart phone, a tablet device, an electronic book reader, a personal digital assistant, a portable multimedia player, etc.) may include an application processor including the power management unit as described above and at least a first memory device, as well as a power management integrated circuit configure to supply an operating voltage to the application processor. The portable device may further include a DRAM and a flash memory. Here, the DRAM and the application processor may be provided in a Package on Package.

One or more exemplary embodiments may be applied to an arbitrary electronic device that includes an integrated circuit such as a system on chip (SOC). For example, the present inventive concept may be applied to electronic devices including an memory device of high capacity and requiring lower power consumption such as a memory card, a solid stage drive (SSD) a computer, a laptop, a digital camera, a cellular phone, a smart-phone, a smart-pad, a personal digital assistants (PDA), a portable multimedia player (PMP), an MP3 player, a navigation system, a video camcorder, a portable game console, etc.

The foregoing is illustrative of exemplary embodiments and is not to be construed as limiting thereof. Although a few exemplary embodiments have been described above, those skilled in the art will readily appreciate that many modifications are possible in these exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the exemplary example embodiments disclosed, and that modifications to the disclosed exemplary embodiments, as well as other exemplary embodiments, are intended to be included within the scope of the appended claims.

What is claimed is:

1. An application processor for a portable device, the application processor comprising:
    a power manager configured to determine a first operating power level, from among a plurality of operating power levels, to determine a first timing margin corresponding to the first operating power level, to generate a first gray code signal indicating the first timing margin, and to output the first gray code signal;
    a first memory device configured to adjust an operation timing according to the first timing margin indicated by the first gray code signal; and
    a decoder configured to convert the first gray code signal output from the power manager to a first binary code signal indicating the first timing margin, and to output the first binary code signal to the first memory device,
    wherein the power manager is configured to provide the first operating power level to the first memory device.

2. The application processor as claimed in claim 1, wherein the power manager comprises:
    a storage configured to store a plurality of gray codes indicating a plurality of timing margins respectively corresponding to the plurality of operating power levels; and
    a register configured to obtain, from among the plurality of gray codes stored in the storage, a gray code indicating the first timing margin according to the first operating power level, and to output the first gray code signal according to the gray code.

3. The application processor as claimed in claim 1, wherein the power manager comprises:
    a storage configured to store a plurality of binary codes indicating a plurality of timing margins respectively corresponding to the plurality of operating power levels;
    an encoder configured to obtain, from among the plurality of binary codes stored in the storage, a binary code indicating the first timing margin according to the first operating power level, and to convert the binary code to a gray code; and
    a register configured to obtain the gray code from the encoder and to output the first gray code signal according to the gray code.

4. The application processor as claimed in claim 1, wherein the first memory device is configured to receive the first binary code signal, and to adjust the operation timing according to the first timing margin indicated by the first binary code signal.

5. The application processor as claimed in claim 1, wherein the power manager is configured to generate a voltage control signal according to the first operating power level and to transmit the voltage control signal to a power controller that provides an operating voltage according to the first operating power level.

6. The application processor as claimed in claim 1, further comprising a second memory device configured to adjust an operation timing thereof according to the first timing margin indicated by the first gray code signal.

7. The application processor as claimed in claim 6, further comprising at least one synchronization circuit configured to synchronize the first gray code signal output from the power manager.

8. The application processor as claimed in claim 1, further comprising a second memory device,
    wherein the power manager is configured to determine a second timing margin, to generate a second gray code signal indicating the second timing margin, and to output the first gray code signal to the first memory device and the second gray code signal to the second memory device.

9. The application processor as claimed in claim 8, wherein:
    the power manager is configured to determine a second operating power level for the second memory device, to generate a voltage control signal according to the first operating power level and the second operating power level, to transmit the generated voltage control signal to a power controller that provides an operating voltage according to the first operating power level and the second operating power level, and to receive the operating voltage from the power controller; and
    the power manager is configured to provide the first operating power level to the first memory device and the second operating power level to the second memory device.

10. The application processor as claimed in claim 1, wherein the power manager is configured to change at least one of an operating voltage and an operating frequency according to the first operating power level.

11. The application processor as claimed in claim 10, wherein when the power manager raises an operating power level to the first operating power level, the power manager is configured to increase the operating voltage, to decrease a timing margin after increasing the operating voltage, and to increase the operating frequency after decreasing the timing margin.

12. The application processor as claimed in claim 10, wherein when the power manager lowers an operating power level to the first operating power level, the power manager is configured to decrease the operating frequency, to increase a timing margin after decreasing the operating frequency, and to decrease the operating voltage after increasing the timing margin.

13. The application processor as claimed in claim 10, wherein the power manager is configured to output a clock control signal to a clock controller in order to change the operating frequency such that the clock controller does not stop outputting a clock signal during a change of the first operating power level.

14. The application processor as claimed in claim 1, wherein the power manager is configured to generate a gray code signal each time an operating power level is determined to be changed.

15. The application processor as claimed in claim 14, wherein the power manager is configured to change the operating power level on a sequential basis, from one operating power level to a next operating power level among the plurality of operating power levels, and to change one bit of the gray code signal each time the operating power level is sequentially changed.

16. A memory device for an application processor of a portable device, the memory device comprising:

a memory core comprising a memory cell; and a controller configured to receive a gray code signal indicating a timing margin corresponding to an operating power level and to control an operation timing of the memory core based on the timing margin, wherein the controller comprises a decoder configured to convert the gray code signal to a binary code signal indicating the timing margin.

17. The memory device as claimed in claim 16, wherein the controller is configured to receive a gray code signal each time the operating power level is determined to be changed.

18. The memory device as claimed in claim 16, wherein the controller is configured to receive the gray code signal from a synchronization circuit of the application processor.

19. A portable device comprising:

an application processor which comprises:

a power manager configured to determine an operating power level, from among a plurality of operating power levels, to determine a first timing margin corresponding to the operating power level, to generate a first gray code signal indicating the first timing margin, and to output the first gray code signal, a first memory device configured to adjust an operation timing according to the first timing margin indicated by the first gray code signal, and a decoder configured to convert the first gray code signal output from the power manager to a first binary code signal indicating the first timing margin, and to output the first binary code signal to the first memory device;

a power management integrated circuit (PMIC) configured to supply an operating voltage to the application processor;

a dynamic random access memory (DRAM); and a flash memory, wherein the power manager is configured to provide, to the first memory device, the operating power level.

* * * * *